US012588152B2

(12) United States Patent
Jang et al.

(10) Patent No.: US 12,588,152 B2
(45) Date of Patent: Mar. 24, 2026

(54) DISPLAY DEVICE INCLUDING DIGITIZER

(71) Applicant: Samsung Display Co., LTD., Yongin-si (KR)

(72) Inventors: Seokwon Jang, Yongin-si (KR); Hyunjae Na, Yongin-si (KR); Youngjin Lee, Yongin-si (KR); Sunhaeng Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/769,682

(22) Filed: Jul. 11, 2024

(65) Prior Publication Data

US 2025/0040062 A1      Jan. 30, 2025

(30) Foreign Application Priority Data

Jul. 28, 2023    (KR) ........................ 10-2023-0098627

(51) Int. Cl.
G06F 3/046      (2006.01)
G06F 1/16      (2006.01)
H05K 5/00      (2006.01)

(52) U.S. Cl.
CPC ......... H05K 5/0018 (2022.08); G06F 1/1641 (2013.01); G06F 3/046 (2013.01)

(58) Field of Classification Search
CPC ...... H05K 5/0018; G06F 1/1641; G06F 3/046
See application file for complete search history.

(56) References Cited

U.S. PATENT DOCUMENTS

| | | | |
|---|---|---|---|
| 11,314,367 | B2 | 4/2022 | Jung |
| 11,500,506 | B2 | 11/2022 | Kishimoto et al. |
| 11,592,951 | B2 | 2/2023 | Kishimoto et al. |
| 11,733,815 | B2 | 8/2023 | Sim et al. |
| 12,001,242 | B2 | 6/2024 | Cho et al. |
| 2022/0043481 | A1 | 2/2022 | Shin et al. |
| 2022/0086267 | A1* | 3/2022 | Shin .................. H04M 1/0268 |
| 2022/0164045 | A1 | 5/2022 | Kishimoto et al. |

(Continued)

FOREIGN PATENT DOCUMENTS

| | | |
|---|---|---|
| KR | 1020200124099 A | 11/2020 |
| KR | 1020210016258 A | 2/2021 |

(Continued)

*Primary Examiner* — Lisa S Landis
(74) *Attorney, Agent, or Firm* — CANTOR COLBURN LLP

(57)      ABSTRACT

A display device includes a display panel including a first non-folding region, a second non-folding region, and a folding region interposed between the first non-folding region and the second non-folding region, and a digitizer disposed under the display panel and divided into an active region and a non-active region surrounding the active region. The digitizer includes a first sensing coil disposed in the active region, a first compensating layer disposed on the first sensing coil to cover the first sensing coil, a second sensing coil disposed under the first sensing coil in the active region, a bridge line disposed under the second sensing coil, and a second compensating layer disposed under the bridge line to cover the bridge line. A surface of the first compensating layer, which is opposite to a surface of the first compensating layer covering the first sensing coil, is flat.

17 Claims, 16 Drawing Sheets

(56)                    References Cited

U.S. PATENT DOCUMENTS

| 2022/0229469 | A1 |   | 7/2022 | Cho et al. |
| 2023/0236629 | A1 | * | 7/2023 | Kishimoto ........... G06F 1/1652 |
|  |  |  |  | 361/679.02 |

FOREIGN PATENT DOCUMENTS

| KR | 1020210133342 | A | 11/2021 |
| KR | 1020210142039 | A | 11/2021 |
| KR | 1020220049066 | A | 4/2022 |
| KR | 1020220072927 | A | 6/2022 |
| KR | 1020220106258 | A | 7/2022 |
| KR | 1020220126326 | A | 9/2022 |
| KR | 1020230113438 | A | 7/2023 |

* cited by examiner

FIG. 7

DISPLAY DEVICE INCLUDING DIGITIZER

This application claims priority to Korean Patent Application No. 10-2023-0098627, filed on Jul. 28, 2023, and all the benefits accruing therefrom under U.S.C. § 119, the content of which in its entirety is herein incorporated by reference.

BACKGROUND

Embodiments of the disclosure described herein relate to a display device.

In general, an electronic device, such as a smart phone, a digital camera, a laptop computer, a navigation, or a smart television, may include a display device to provide an image to a user. The display device generates an image and provides the generated image to the user through a display screen.

Recently, with the development of a technology of display devices, various types of display devices have been developed. For example, various flexible display devices, which are changed in shape to a curved shape, or are bent, or rolled, have been developed. The flexible display device may be easy in portability and improve the convenience of a user.

A folding display device of the flexible display devices may be folded about a folding axis. The folding display device may include a display module foldable about the folding axis and a support unit disposed under the display module to support the display module. The support unit may be folded together with the display module when the folding display device is folded.

The folding display device may further include a digitizer disposed under the display module. The digitizer may sense an electromagnetic change made through the access of a pen placed on the display device and may detect the position of the pen.

SUMMARY

Embodiments of the disclosure provide a display device improved in surface quality and reliability.

According to an embodiment of the disclosure, a display device includes a display panel including a first non-folding region, a second non-folding region, and a folding region interposed between the first non-folding region and the second non-folding region, and a digitizer disposed under the display panel and divided into an active region and a non-active region surrounding the active region. In such an embodiment, the digitizer includes a first sensing coil disposed in the active region, a first compensating layer disposed on the first sensing coil to cover the first sensing coil, a second sensing coil disposed under the first sensing coil, under the active region, a bridge line disposed under the second sensing coil, and a second compensating layer disposed under the bridge line to cover the bridge line. In such an embodiment, a surface of the first compensating layer, which is opposite to a surface of the first compensating layer covering the first sensing coil, is flat.

According to an embodiment of the disclosure, a display device includes a display panel, and a digitizer disposed under the display panel. In such an embodiment, the digitizer includes a first sensing coil, a first compensating layer including a first first surface covering the first sensing coil, and a second first surface opposite to the first first surface, a second sensing coil disposed under the first sensing coil, a bridge line disposed under the second sensing coil, and a second compensating layer including a first second surface covering the bridge line and a second second surface opposite to the first second surface, where a shape of the second first surface is symmetrical to a shape of the second second surface.

BRIEF DESCRIPTION OF THE DRAWINGS

The above and other features of embodiments of the disclosure will become apparent by describing in detail embodiments thereof with reference to the accompanying drawings.

FIG. 7 is a cross-sectional view taken along line I-I' illustrated in FIG. 5.

DETAILED DESCRIPTION

Figure 1:
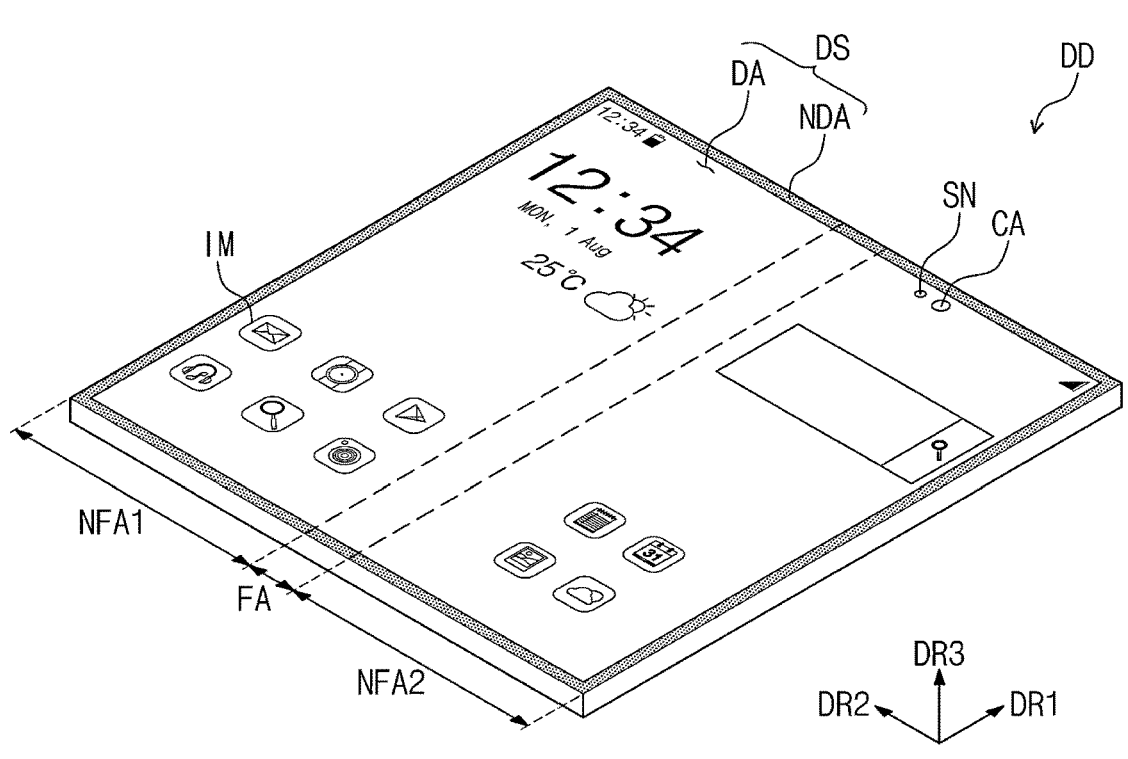
FIG. 1 is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

When an element or a layer is disposed "on" another element or another layer, the element or the layer may be directly disposed on another element or the layer and still another layer or still another element may be interposed between the element or the layer and the another element or the layer. Meanwhile, when a device or a layer is disposed "directly on" another device or another layer, still another device or still another layer is not interposed between the device or the layer and the another device or the another layer.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, or section discussed below could be termed a second element, component, or section without departing from the teachings of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the specification, embodiments will be described with reference to a plan view and a cross-sectional view which are ideal schematic views of the disclosure. Accordingly, the shape of a figure in an accompanying drawings may be deformed due to manufacturing technologies and/or tolerances. Accordingly, embodiments of the disclosure are not limited to a specific shape and includes the variation of the shape formed depending on the manufacturing process. Accordingly, regions illustrated in accompanying drawings have schematic attributes. Accordingly, the shapes of regions illustrated in the accompanying drawings merely show the specific shapes of the regions of the device, and do not limit the scope of the disclosure.

Hereinafter, embodiments of the disclosure will be described with reference to accompanying drawings in detail.

Figure 2:
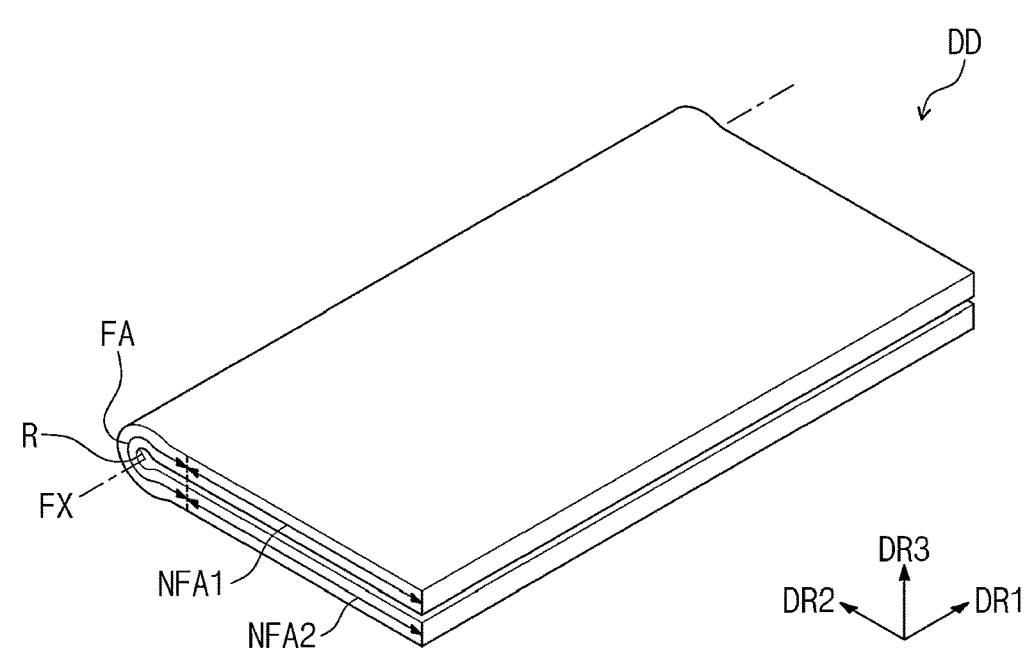
FIG. 2 is a view illustrating the folding state of a display device illustrated in FIG. 1.

FIG. 1 is a perspective view of a display device according to an embodiment of the disclosure. FIG. 2 is a view illustrating the folding state of a display device illustrated in FIG. 1.

Referring to FIG. 1, according to an embodiment of the disclosure, a display device DD may have a shape of a rectangle having a longer side extending in a first direction DR1 and a shorter side extending in a second direction DR2 crossing the first direction DR1. However, an embodiment is not limited thereto, and the display device DD may have various shapes such as a circle or a polygon. The display device DD may be a flexible display device.

Hereinafter, a direction substantially perpendicular to a plane defined by the first direction DR1 and the second direction DR2 is defined as a third direction DR3. The third direction DR3 may be a thickness direction of the display device DD. In the disclosure, the wording "when viewed in a plan view" may refer to the state when viewed in the third direction DR3.

The display device DD may include a folding region FA and a plurality of non-folding regions NFA1 and NFA2. The non-folding regions NFA1 and NFA2 may include the first non-folding region NFA1 and the second non-folding region NFA2. The folding region FA may be interposed between the first non-folding region NFA1 and the second non-folding region NFA2. The folding region FA, the first non-folding region NFA1, and the second non-folding region NFA2 may be arranged in the second direction DR2.

In an embodiment, for example, one folding region FA and two non-folding regions NFA1 and NFA2 may be provided as illustrated in FIGS. 1 and 2, but the number of folding region FA and the non-folding regions NFA1 and NFA2 is not limited thereto. In an embodiment, for example, the display device DD may include more than two non-folding regions, and a plurality of folding regions interposed between the non-folding regions.

A top surface of the display device DD may be defined as a display surface DS and may have the plane defined by the first direction DR1 and the second direction DR2. Images IM generated by the display device DD may be provided to a user US through the display surface DS.

The display surface DS may include a display region DA and a non-display region NDA around the display region DA. The display region DA is to display an image and the non-display region NDA is not to display the image. The non-display region NDA may be defined as an edge area or bezel of the display device DD to surround the display region DA and printed with a specific color.

The display device DD may include at least one sensor SN and at least one camera CA. The sensor SN and the camera CA may be adjacent to the edge of the display device DD. The sensor SN and the camera CA may be provided in the display region DA adjacent to the non-display region NDA. In an embodiment, as shown in FIG. 1, the sensor SN and the camera CA may be disposed in the second non-folding region NFA2, but the disclosure is not limited thereto. The sensor SN and the camera CA may be provided in the first non-folding region NFA1.

As light is transmitted through parts of the display device DD, in which the sensor SN and the camera CA are provided, the light may be provided to the camera CA and the sensor SN. In an embodiment, for example, the sensor SN may be a proximity sensor, but the type of the sensor SN is not limited thereto. The camera CA may capture an external image. In an embodiment, the sensor SN and the camera CA may be provided in plural, that is, a plurality of sensors SN and a plurality of cameras CA may be provided.

Referring to FIG. 2, an embodiment of the display device DD may be the foldable display device DD which is folded or unfolded. For example, as the folding region FA is bent about a folding axis FX parallel to the first direction DR1, the display device DD may be folded. The folding axis FX may be defined as a longer (longitudinal or major) axis parallel to a longer side of the display device DD.

When the display device DD is folded, the first non-folding region NFA1 and the second non-folding region NFA2 may face each other, and the display device DD may be in the in-folding state, such that the display surface DS is not exposed to the outside. However, an embodiment of the disclosure is not limited thereto. For example, the display device DD may be in an out-folding state such that the display surface DS is exposed to the outside about the folding axis FX.

Figure 3:
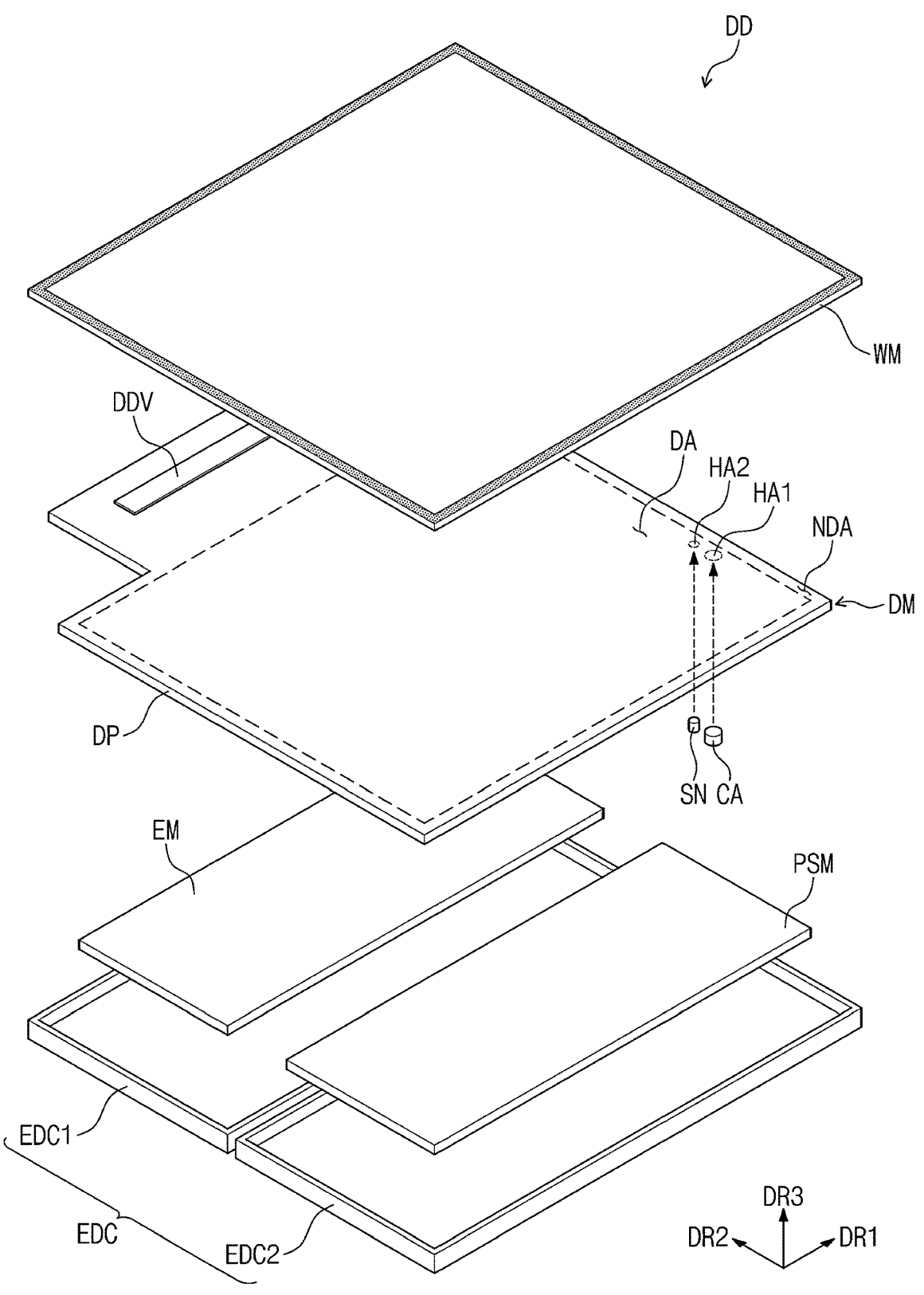
FIG. 3 is an exploded perspective view of the electronic device of FIG. 1.

In an embodiment, the distance between the first non-folding region NFA1 and the second non-folding region NFA2 may be smaller than twice the radius R (for example, a diameter) of curvature of a folded or curved portion. In such an embodiment, the folding region FA may be folded in the form of a dumbbell. FIG. 3 is an exploded perspective view of the electronic device of FIG. 1.

Referring to FIG. 3, an embodiment of the display device DD may include a window module WM, a display module DM, the camera CA, the sensor SN, an electronic module EM, a power supply module PSM, and a case EDC. Although not illustrated separately, the display device DD may further include a mechanic structure (for example, a hinge) to control the folding operation of the display module DM.

The display module DM may generate an image and sense an input applied from the outside. The window module WM may define the front surface of the display module DM. The window module WM may be disposed on the display module DM to protect the display module DM. The window module WM may transmit light generated from the display module DM and provide the light to a user.

The display module DM may include at least display panel DP. Although FIG. 3 illustrates only the display panel DP of the stack structure of the display module DM for convenience of illustration, it would be understood that the display module DM may further actually include a plurality of components interposed between an upper portion and a lower portion of the display panel DP. The detailed stack structure of the display module DM will be described in detail later. The display panel DP may include the display region DA and the non-display region NDA corresponding to the display region DA (see FIG. 1) and the non-display region NDA (see FIG. 1) of the display device DD, respectively.

A first hole region HA1 and a second hole region HA2 may be defined in the display panel DP. The first hole region HA1 and the second hole region HA2 may have light transmittance higher than peripheral light transmittance, that is, light transmittance of an adjacent region thereof. The camera CA may be provided under the first hole region HA1, and the sensor SN may be provided under the second hole region HA2. The light transmitted through the first and second hole regions HA1 and HA2 may be provided to the camera CA and the sensor SN.

The display module DM may include a data driving unit DDV disposed on the non-display region NDA of the display panel DP. The data driving unit DDV may be manufactured in an integral circuit chip form and mounted on the non-display region NDA. However, the disclosure is not limited thereto. In an embodiment, for example, the data driving unit DDV may be mounted on a flexible circuit board connected or linked to the display panel DP.

The electronic module EM and the power supply module PSM may be disposed under the display module DM. Although not illustrated, the electronic module EM and the power supply module PSM may be connected or linked to each other through an additional flexible circuit board. The electronic module EM may control the operation of the display module DM. The power supply module PSM may supply power to the display module DM.

The case EDC may receive the window module WM, the display module DM, the electronic module EM, and the power supply module PSM. The case EDC may include two first and second cases EDC1 and EDC2 to fold the display module DM. The first and second cases EDC1 and EDC2 may be arranged in the second direction DR2 while extending in the first direction DR1.

Although not illustrated, the display device DD may further include a hinge structure to link the first and second cased EDC1 and EDC2 to each other. The case EDC may be coupled to the window module WM. The case EDC may protect the window module WM, the display module DM, the electronic module EM, and the power supply module PSM.

Figure 4:
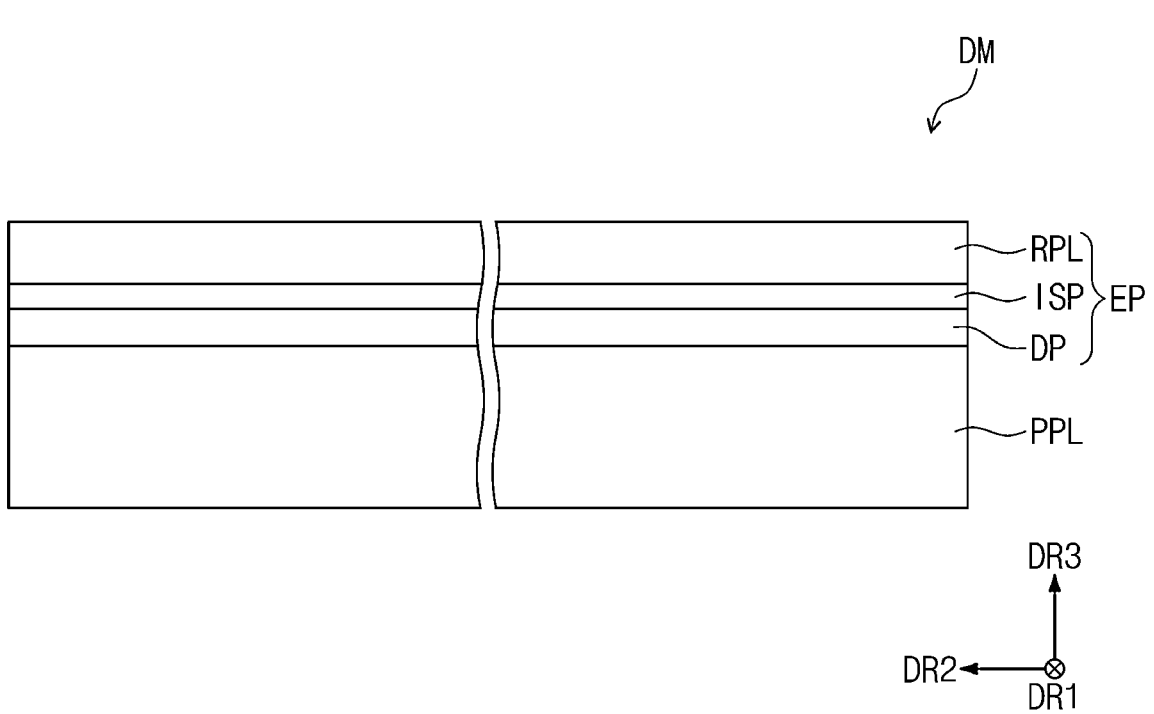
FIG. 4 is a cross-sectional view schematically illustrating a display module illustrated in FIG. 3.

FIG. 4 is a cross-sectional view schematically illustrating a display module illustrated in FIG. 3.

Referring to FIG. 4, an embodiment of the display module DM may include an electronic panel EP and a panel protecting layer PPL disposed under the electronic panel EP. The electronic panel EP may include the display panel DP, an input sensing unit ISP disposed on the display panel DP, and an anti-reflective layer RPL disposed on the input sensing unit ISP. The display panel DP may be a flexible display panel. In an embodiment, for example, the display panel DP may include the flexible display panel and a plurality of devices disposed on the flexible display panel.

According to an embodiment of the disclosure, the display panel DP may be an emissive-type panel, but the disclosure is not particularly limited thereto. In an embodiment, for example, the display panel DP may be an organic light emitting display panel or an inorganic light emitting display panel. The light emitting layer of the organic light emitting display panel may include an organic light emitting material. The light emitting layer of the inorganic light emitting display panel may include a quantum dot, or a quantum rod. Hereinafter, for convenience of description, embodiments where the display panel DP is an organic light emitting display panel will be described, but not being limited thereto.

The input sensing unit ISP may include a plurality of sensing parts (not illustrated) to sense an external input in a capacitive manner. The input sensing unit ISP may be directly formed on the display panel DP when manufacturing the display module DM.

The anti-reflective layer RPL may be disposed on the input sensing unit ISP. The anti-reflective layer RPL may be directly disposed on the input sensing unit ISP when the display module DM is manufactured. The anti-reflective layer RPL may be defined as a film to prevent external light from being reflected. The anti-reflective layer RPL may reduce the reflectance of external light incident from the top surface of the display device DD toward the display panel DP.

In an embodiment, the input sensing unit ISP may be directly formed on the display panel DP, and the anti-reflective layer RPL may be directly formed on the input sensing unit ISP, but an embodiment of the disclosure is not limited thereto. In an embodiment, for example, the input sensing unit ISP may be separately manufactured, and attached to the display panel DP through an adhesive layer, and the anti-reflective layer RPL may be separately manufactured and may be attached to the input sensing unit ISP by the adhesive layer.

The panel protecting layer PPL may be disposed under the display panel DP. The panel protecting layer PPL may protect a lower portion of the display panel DP. The panel protecting layer PPL may include a flexible plastic material. In an embodiment, for example, the panel protecting layer PPL may include polyethylene terephthalate (PET).

Figure 5:
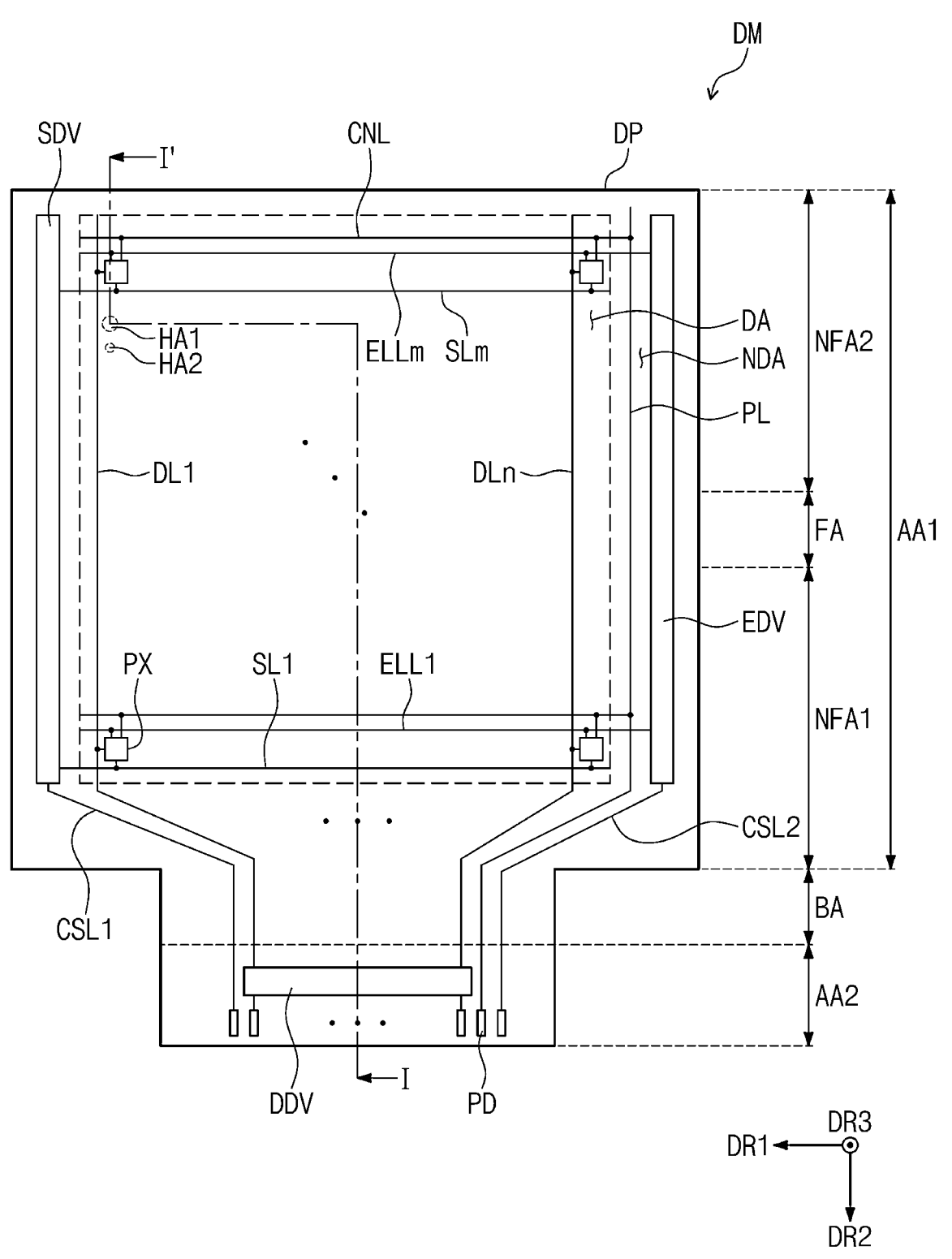
FIG. 5 is a plan view of a display module illustrated in FIG. 3.

FIG. 5 is a plan view of a display module illustrated in FIG. 3.

Referring to FIG. 5, an embodiment of the display module DM may include the display panel DP, a scan driving unit SDV, a data driving unit DDV, and an emission driving unit EDV.

The display panel DP may include a first region AA1, a second region AA2, and a bending region BA interposed between the first region AA1 and the second region AA2. The bending region BA may extend in the first direction DR1, and the first region AA1, the bending region BA, and the second region AA2 may be arranged in the second direction DR2.

The first region AA1 may include the display region DA and the non-display region NDA around the display region DA. The non-display region NDA may surround the display region DA. The display region DA may be a region for displaying an image, and the non-display region NDA may be a region in which the image is not displayed. The second region AA2 and the bending region BA may be regions in which the image is not displayed.

The first region AA1 may include the first non-folding region NFA1, the second non-folding region NFA2, and the folding region FA interposed between the first non-folding region NFA1 and the second non-folding region NFA2 when viewed in the first direction DR1. The first and second hole regions HA1 and HA2 described above may be defined in the display region DA and the second non-folding region NFA2.

The display panel DP may include a plurality of pixels PX, a plurality of scan lines SL1 to SLm, a plurality of data lines DL1 to DLn, a plurality of light emitting lines ELL1 to ELLm, first and second control lines CSL1 and CSL2, a power lines PL, a plurality of connecting lines CNL, and a plurality of pads PD. Here, 'm' and 'n' are natural numbers. The pixels PX may be disposed in the display region DA, and may be connected to the scan lines SL1 to SLm, the data lines DL1 to DLn, and the light emitting lines ELL1 to ELLm.

The scan driving unit SDV and the light emitting driving unit EDV may be disposed in the non-display region NDA. The scan driving unit SDV and the light emitting driving unit EDV may be disposed in the non-display region NDA adjacent to side portions of the first region AA1, which are opposite to each other in the first direction DR1. The data driving unit DDV may be disposed in the second region AA2. The data driving unit DDV may be manufactured in an integral circuit chip form and mounted on the second region AA2.

The scan lines SL1 to SLm may be electrically connected to the scan driving unit SDV while extending in the first direction DR1. The plurality of data lines DL1 to DLn may extend in the second direction DR2 and may be connected to the data driving unit DDV through the bending region BA. The light emitting lines ELL1 to ELLm may be electrically connected to the light emitting driving unit EDV while extending in the first direction DR1.

The power line PL may extend in the second direction DR2 and may be disposed in the non-display region NDA. The power line PL may be interposed between the display region DA and the light emitting driving unit EDV, but the disclosure is not limited thereto. In an embodiment, for example, the power line PL may be interposed between the display region DA and the scan driving unit SDV.

The power line PL may extend in the second region AA2 through the bending region BA. The power line PL may extend toward the lower end portion of the second region AA2 when viewed in a plan view. The power line PL may receive a driving voltage.

The connecting lines CNL may extend in the first direction DR1 while being arranged in the second direction DR2. The connecting lines CNL may be linked to the power line PL and the pixels PX. The driving voltage may be applied to the pixels PX through the power line PL and the connecting lines CNL connected to each other.

The first control line CSL1 may be connected to the scan driving unit SDV and may extend toward the lower end portion of the second region AA2 through the bending region BA. The second control line CSL2 may be connected to the light emitting driving unit EDV and may extend toward the lower end portion of the second region AA2 through the bending region BA. The data driving unit DDV may be interposed between the first control line CLS1 and the second control line CSL2.

The pads PD may be disposed to be adjacent to the lower end portion of the second region AA2 when viewed in a plan view. The data driving unit DDV, the power line PL, the first control line CSL1, and the second control line CSL2 may be connected to the pads PD.

The data lines DL1 to DLn may be connected to relevant pads PD through the data driving unit DDV. In an embodiment, for example, the data lines DL1 to DLn may be connected to the data driving unit DDV, and the data driving unit DDV may be connected to the pads PD corresponding to the data lines DL1 to DLn.

Although not illustrated, a printed circuit board is connected to the pads PD, and a timing controller and a voltage generator may be disposed on the printed circuit board. The timing controller may be manufactured in an integral circuit chip and may be mounted on the printed circuit board. The timing controller and the voltage generator may be connected to the pads PD through the printed circuit board.

The timing controller may control the operations of the scan driving unit SDV, the data driving unit DDV, and the light emitting driving unit EDV. The timing controller may generate a scan control signal, a data control signal, and a light emitting control signal in response to control signals received from the outside. The voltage generator may generate a driving voltage.

The scan control signal may be provided to the scan driving unit SDV through the first control line CSL1. The light emitting control signal may be provided to the light emitting driving unit EDV through the second control line CSL2. The data control signal may be provided to the data driving unit DDV. The timing controller may receive image signals from the outside, and convert the data format of the image signals to be matched to the interface specification with the data driving unit DDV, such that the converted signals are provided to the data driving unit DDV.

The scan driving unit SDV may generate a plurality of scan signals in response to the scan control signal. The scan signals may be applied to the pixels through the scan lines SL1 to SLm. The scan signals may be sequentially applied to the pixels PX.

The data driving unit DDV may generate a plurality of data voltages corresponding to the image signals, in response to the data control signal. The data voltages may be applied to the pixels through the data lines DL1 to DLn. The light emitting driving unit EDV may generate a plurality of light emitting signals, in response to the light emitting control signal. The light emitting signals may be applied to the pixels through the light emitting lines ELL1 to ELLm.

The pixels PX may receive data voltages in response to the scan signals. The pixels PX may display the image, as the pixels PX emit light having brightness corresponding to data voltages, in response to the light emitting signals. The time for emitting light from the pixels PX may be controlled by the light emitting signals.

Figure 6:
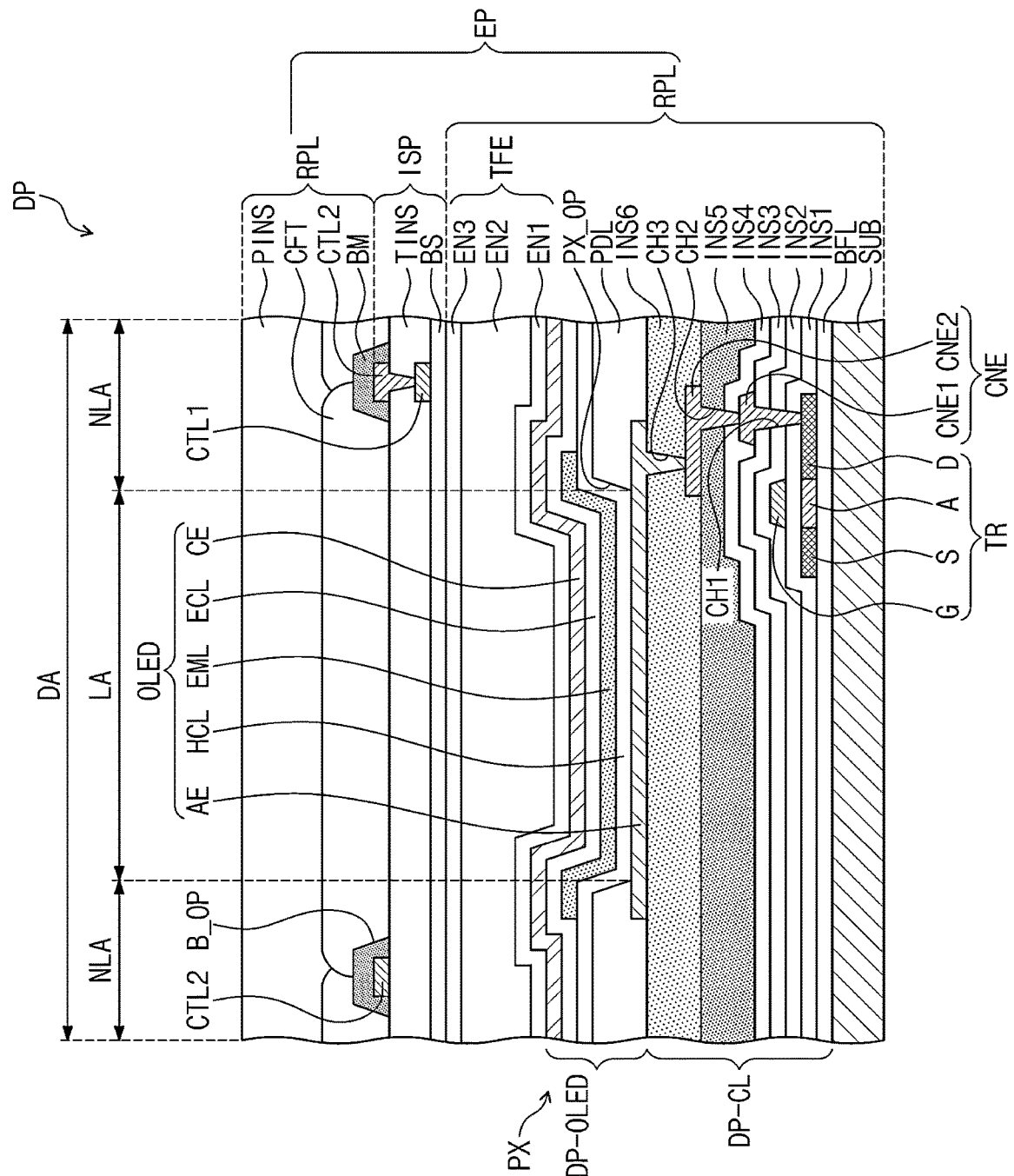
FIG. 6 is a cross-sectional view illustrating a cross-section of an electronic panel corresponding to any one pixel illustrated in FIG. 5.

FIG. 6 is a cross-sectional view illustrating a cross-section of an electronic panel corresponding to any one pixel illustrated in FIG. 5.

Referring to FIG. 6, in an embodiment, the pixel PX may include a transistor TR and a light emitting element OLED. The light emitting element OLED may include a first electrode AE (or an anode), a second electrode CE (or a cathode), a hole control layer HCL, an electron control layer ECL, and a light emitting layer EML.

The transistor TR and the light emitting element OLED may be disposed on a substrate SUB. In FIG. 6, although one transistor TR is illustrated for convenience of illustration, the pixel PX may include a plurality of transistors to drive the light emitting element OLED and at least one capacitor.

The display region DA may include a light emitting region LA and a non-light emitting region NLA provided at a peripheral portion of the light emitting region LA, which correspond to each pixel PX. The light emitting element OLED may be disposed in the light emitting region LA.

A buffer layer BFL may be disposed on the substrate SUB. The buffer layer BFL may be an inorganic layer. A semiconductor pattern may be disposed on the buffer layer BFL. The semiconductor pattern may include polysilicon, amorphous silicon, or a metal oxide.

The semiconductor pattern may be doped with an N-type dopant or a P-type dopant. The semiconductor pattern may include a heavily doped region and a lightly doped region. Conductivity of the heavily doped region may be greater than that of the lightly doped region. The heavily doped region may substantially operate as a source electrode or a drain electrode of the transistor TR. The lightly doped region may substantially correspond to an active (or a channel) of a transistor.

A source S, an active A, and a drain D of the transistor TR may be formed from (or defined by portions of) the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 to connect the transistor TR to the light emitting element OLED. The first connection electrode CNE1 may be disposed on the third insulating layer INS3 and may be connected to the drain D through a first contact hole CH1 defined in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined in the fourth and fifth insulating layers INS4 and INS5.

A sixth insulating layer INS6 may be disposed on the second connection electrode CNE2. Layers including the buffer layer BFL to the sixth insulating layer INS6 may be defined as a circuit element layer DP-CL. The first to sixth insulating layers INS1 to INS6 may be inorganic layers or organic layers.

The first electrode AE may be disposed on the sixth insulating layer INS6. The first electrode AE may be connected to the second connection electrode CNE2 through a third contact hole CH3 defined in the sixth insulating layer INS6. A pixel defining layer PDL may be disposed on the first electrode AE and the sixth insulating layer INS6 to define an opening PX_OP that exposes a specific portion of the first electrode AE.

The hole control layer HCL may be disposed on the first electrode AE and the pixel defining layer PDL. The hole control layer HCL may include a hole transport layer and a hole injection layer.

The light emitting layer EML may be disposed on the hole control layer HCL. The light emitting layer EML may be disposed in a region corresponding to the opening PX_OP. The light emitting layer EML may include an organic material and/or an inorganic material. The light emitting layer EML may generate light in any one of red, green, and blue.

The electron control layer ECL may be disposed on the light emitting layer EML and the hole control layer HCL. The electron control layer ECL may include an electronic transport layer and an electronic injection layer. The hole control layer HCL and the electron control layer ECL may be disposed in the light emitting region LA and the non-light emitting region NLA commonly.

The second electrode CE may be disposed on the electron control layer ECL. The second electrode CE may be disposed in the pixels PX in common. The layer in which the light emitting element OLED is disposed may be defined as a display element layer DP-OLED.

A thin film encapsulating layer TFE may be disposed on the second electrode CE to cover the pixel PX. The thin film encapsulating layer TFE may include a first encapsulating layer EN1, a second encapsulating layer EN2 on the first encapsulating layer EN1, and a third encapsulating layer EN3 on the second encapsulating layer EN2.

The first and third encapsulating layers EN1 and EN3 may include an inorganic insulating layer and protect the pixel PX from moisture/oxygen. The second encapsulating layer EN2 may protect the pixel PX from foreign substances such as dust particles.

The first voltage may be applied to the first electrode AE through the transistor TR, and a second voltage having a level lower than a level of the first voltage may be applied to the second electrode CE. An exciton may be formed as a hole and an electron injected into the light emitting layer EML are combined with each other. As the exciton transits to a ground state, the light emitting element OLED may emit light.

The input sensing unit ISP may be disposed on the thin film encapsulating layer TFE. In an embodiment, the input sensing unit ISP may be directly manufactured on the top surface of the thin film encapsulating layer TFE.

The base layer BS may be disposed on the thin film encapsulating layer TFE. The base layer BS may include an in organic insulating layer. At least one inorganic insulating layer may serve as the base layer BS and may be disposed on the thin film encapsulating layer TFE.

The input sensing unit ISP may include a first conductive pattern CTL1 and a second conductive pattern CTL2 disposed on the first conductive pattern CTL1. The first conductive pattern CTL1 may be disposed on the base layer BS. An insulating layer TINS may be disposed on the base layer BS to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-light emitting region NLA. In an embodiment, the first and second conductive patterns CTL1 and CTL2 may be disposed in the non-light emitting region NLA between light emitting regions LA.

The first and second conductive patterns CTL1 and CTL2 may form sensors of the input sensing unit ISP described above. In an embodiment, for example, the first and second conductive patterns CTL1 and CTL2 in the mesh form may be separated from each other in a specific region to form the sensors. A portion of the second conductive pattern CTL2 may be connected or linked to the first conductive pattern CTL1.

The anti-reflective layer RPL may be disposed on the second conductive pattern CTL2. The anti-reflective layer RPL may include a black matrix BM and a plurality of color filters CFT. The black matrix BM may overlap the non-light emitting region NLA and the color filters CFT may overlap each of the light emitting regions LA.

The black matrix BM may be disposed on the insulating layer TINS to cover the second conductive pattern CTL2. The light emitting region LA and the opening B_OP overlapping the opening PX_OP may be defined in the black matrix BM. The black matrix BM may absorb light to block the light. The width of the opening B_OP may be greater than the width of the opening PX_OP.

The color filters CFT may be disposed on the insulating layer TINS and the black matrix BM. The color filters CFT may be disposed on the opening B_OP. A planarization insulating layer PINS may be disposed on the color filters CFT. The planarization insulating layer PINS may provide a flat top surface When the external light toward the display panel DP is reflected from the display panel DP and provided again to an external user, the user may visually view the external light, which is similar to a mirror. To prevent the above phenomenon or to reduce such reflection of external light, the anti-reflective layer RPL may include a plurality of color filters to display the same color as that of the pixels of the display panel DP. The color filters CFT may filter out colors of external light which are the same as those of the pixels PX. In this case, the external light may not be viewed to the user.

However, an embodiment of the disclosure is not limited thereto. In an embodiment, the anti-reflective layer RPL may include a polarizing film to reduce the reflectance index of the external light. The polarizing film may be separately manufactured and may be attached to the input sensing unit ISP by the adhesive layer. The polarizing film may include a phase retarder and/or a polarizer.

Figure 7:
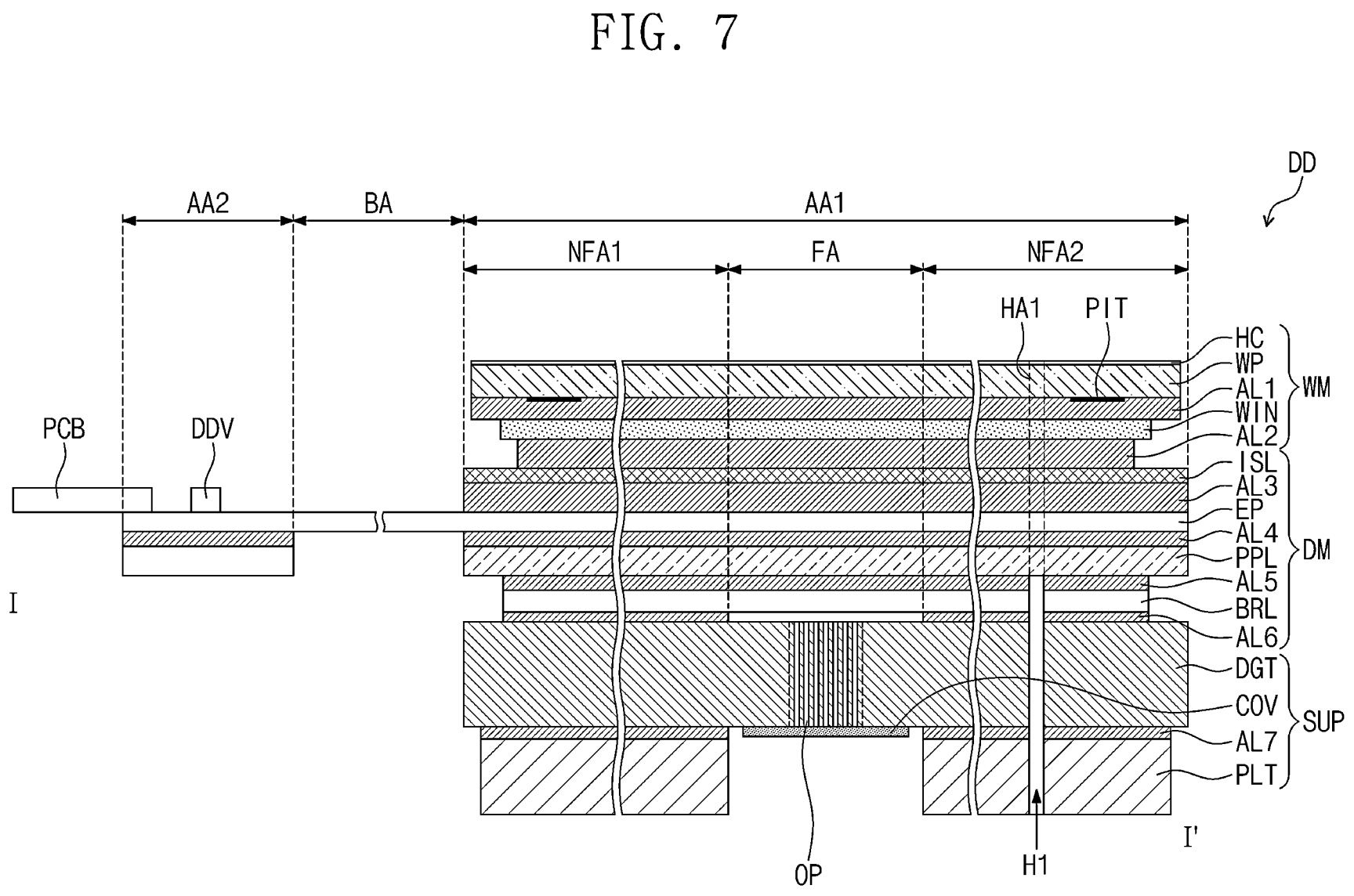
Figure 8:
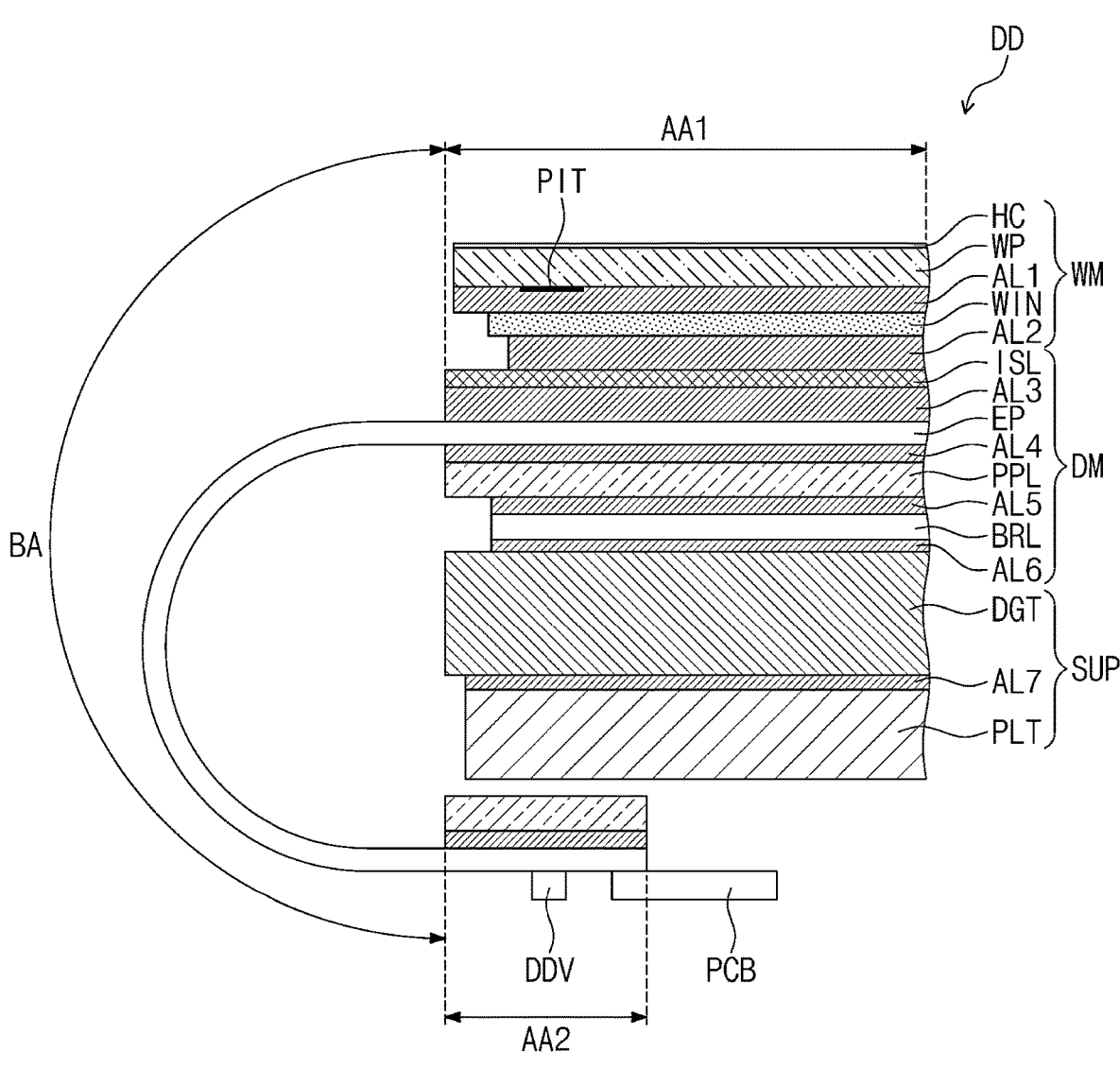
FIG. 8 is a view illustrating a bending region illustrated in FIG. 7 in a bent state.

FIG. 7 is a cross-sectional view taken along line I-I' illustrated in FIG. 5. FIG. 8 is a view illustrating the bending region illustrated in FIG. 7 in a bent state.

Particularly, FIG. 7 illustrates that a cross section of the display module DM corresponding to the line I-I' and a cross section of the window module WM.

Referring to FIG. 7, an embodiment of the display device DD may include the display module DM, the window module WM disposed on the display module DM, and a support unit SUP disposed under the display module DM. The display module DM may be a flexible display module. The display module DM may include the first non-folding region NFA1, the folding region FA, and the second non-folding region NFA2.

The window module WM may include a window WIN, a window protecting layer WP, a hard coating layer HC, and first and second adhesive layers AL1 and AL2. The display module DM may include the electronic panel EP, an impact absorbing layer ISL, the panel protecting layer PPL, a barrier layer BRL, and third to sixth adhesive layers AL3 to AL6. The support unit SUP may include a digitizer DGT, a supporting plate PLT, a cover layer COV, and a seventh adhesive layer AL7.

The configurations or features of the electronic panel EP and the panel protecting layer PPL are substantially the same as those described above with reference to FIG. 4, and thus any repetitive detailed description thereof will be omitted. The impact absorbing layer ISL may be disposed on the electronic panel EP. The impact absorbing layer ISL may protect the electronic panel EP by absorbing an external impact applied from the top of the display device DD toward the electronic panel EP. The impact absorbing layer ISL may be manufactured in the form of a stretched film.

The impact absorbing layer ISL may include a flexible plastic material. The flexible plastic material may be defined as a synthetic resin film. In an embodiment, for example, the impact absorbing layer ISL may include flexible plastic materials such as polyimide PI or polyethylene terephthalate PET.

The window WIN may be disposed on the impact absorbing layer ISL. The window WIN may protect the electronic panel EP from external scratches. The window WIN may have an optically transparent property. In an embodiment, the window WIN may include glass. However, the disclosure is not limited thereto, and the window WIN may include a synthetic resin film.

The window WIN may have a multi-layer structure or a single-layer structure. In an embodiment, for example, the window WIN may include synthetic resin films bonded to each other through adhesives, or a glass substrate and a synthetic resin film coupled to each other by the adhesive.

The window protecting layer WP may be disposed on the window WIN. The window protecting layer WP may include a flexible plastic material such as polyimide or polyethylene terephthalate. The hard coating layer HC may be disposed on the top surface of the window protecting layer WP.

A printing layer PIT may be disposed on a bottom surface of the window protecting layer WP. In an embodiment, the printing layer PIT may have a black color, but the color of the printing layer PIT is not limited thereto. The printing layer PIT may be adjacent to the edge of the window protecting layer WP.

The barrier layer BRL may be disposed under the panel protecting layer PPL. The barrier layer BRL may increase resistance to compression force resulting from external pressing. Accordingly, the barrier layer BRL may prevent the electronic panel EP from being deformed. The barrier layer BRL may include a flexible plastic material such as polyimide or polyethylene terephthalate.

The barrier layer BRL may have a color which absorbs light. In an embodiment, for example, the barrier layer BRL may have a black color. In this case, when the display module DM is viewed from above the display module DM, the components disposed under the barrier layer BRL may not be viewed.

The first adhesive layer AL1 may be interposed between the window protecting layer WP and the window WIN. The window protecting layer WP and the window WIN may be bonded to each other by the first adhesive layer AL1. The first adhesive layer AL1 may cover the printing layer PIT.

The second adhesive layer AL2 may be interposed between the window WIN and the impact absorbing layer ISL. The window WIN and the impact absorbing layer ISL may be combined to each other through the second adhesive layer AL2.

The third adhesive layer AL3 may be interposed between the impact absorbing layer ISL and the electronic panel EP. The impact absorbing layer ISL and the electronic panel EP may be combined to each other through the third adhesive layer AL3.

The fourth adhesive layer ALA may be interposed between the electronic panel EP and the panel protecting layer PPL. The electronic panel EP and the panel protecting layer PPL may be combined to each other by the fourth adhesive layer AL4.

The fifth adhesive layer AL5 may be interposed between the panel protecting layer PPL and the barrier layer BRL. The panel protecting layer PPL and the barrier layer BRL may be combined to each other by the fifth adhesive layer AL5.

The sixth adhesive layer AL6 may be interposed between the barrier layer BRL and the digitizer DGT. The barrier layer BRL and the digitizer DGT may be combined to each other by the sixth adhesive layer AL6.

The sixth adhesive layer AL6 may overlap the first and second non-folding regions NFA1 and NFA2, and may not overlap the folding region FA. In other words, the sixth adhesive layer AL6 may not be disposed in the folding region FA.

The digitizer DGT may be disposed under the barrier layer BRL. The digitizer DGT may include a plurality of layers, which will be described in detail later.

The digitizer DGT may support the display module DM under the display module DM. In an embodiment, for example, the digitizer DGT may include a non-metallic material, such as a reinforced fiber composite, to be rigid more than the display module DM. The reinforced fiber composite may be carbon fiber reinforced plastic (CFRP) or glass fiber reinforced plastic (GFRP). Hereinafter, for convenience of description, embodiments where the digitizer DGT has a structure including glass fiber reinforced plastic will be described in detail, but not being limited thereto.

The digitizer DGT is a device to receive information on a position indicated by a user on a display surface. The digitizer DGT may be implemented in an electromagnetic method (or electromagnetic resonance). In an embodiment, for example, the digitizer DGT may include a digitizer sensor substrate (not illustrated) including a plurality of coils. However, the disclosure is not limited thereto, and the digitizer DGT may be implemented through active electrostatic.

When a user moves an electromagnetic pen on the display device DD, the electromagnetic pen is driven in response to an alternating current (AC) signal to generate a vibrating magnetic field, and the magnetic field oscillating may induce a signal to a coil. The position of the electromagnetic pen may be detected through a signal induced in the coil. The digitizer DGT may determine the position of the electromagnetic pen by detecting an electromagnetic change caused by the approach of the electromagnetic pen.

A plurality of openings OP may be defined in a portion of the digitizer DGT, which overlaps the folding region FA. The openings OP may be formed through a portion of the digitizer DGT in the third direction DR3. The openings OP may be formed in the digitizer DGT through a laser process or a micro-blast process.

Since the openings OP are defined in a portion of the digitizer DGT which overlaps the folding region FA, the flexibility in the portion of the digitizer DGT overlapping the folding region FA may be increased. Accordingly, the digitizer DGT may be easily folded about the folding region FA.

The cover layer COV may be disposed under the digitizer DGT. The cover layer COV may cover the openings OP defined in the digitizer DGT under the digitizer DGT. The cover layer COV may overlap the folding region FA and may not overlap the first and second non-folding regions NFA1 and NFA2. In other words, the cover layer COV may not be disposed in the first and second non-folding regions NFA1 and NFA2. The cover layer COV may contact a bottom surface of a portion of the digitizer DGT in which the openings OP are formed.

The cover layer COV may have an elastic modulus lower than that of the digitizer DGT. In an embodiment, for example, the cover layer COV may include thermoplastic polyurethane or rubber, but the material of the cover layer COV is not limited thereto. The cover layer COV may be fabricated in the form of a sheet and attached to the digitizer DGT.

The supporting plate PLT may be disposed under the digitizer DGT. The supporting plate PLT may overlap the first and second non-folding regions NFA1 and NFA2, respectively, and may not overlap the folding region FA. The supporting plate PLT may be divided into two parts and disposed under the first and second non-folding regions NFA1 and NFA2, respectively.

The supporting plate PLT may be rigid more than the display module DM. in an embodiment, the supporting plate PLT may include a metal material, such as stainless steel (e.g., SUS 316), but the material of the supporting plate PLT is not limited thereto. In an embodiment, the supporting plate PLT may include a non-metallic material such as plastic.

The seventh adhesive layer AL7 may be interposed between the digitizer DGT and the supporting plate PLT. The digitizer DGT and the supporting plate PLT may be combined to each other by the seventh adhesive layer AL7. The seventh adhesive layer AL7 may not be disposed in the folding region FA.

The first to seventh adhesive layers AL1 to AL7 may include a transparent adhesive such as a pressure sensitive adhesive (PSA) or an optically clear adhesive (OCA), but the type of adhesive is not limited thereto.

A first hole H1 may be defined in the portion of the display module DM overlapping the first hole region HA1. The first hole H1 may be defined from the supporting plate PLT to a previous layer of (or a layer immediately below) the panel protecting layer PPL. In an embodiment, for example, the first hole H1 may be integrally defined in the barrier layer BRL, the digitizer DGT, the supporting plate PLT, and the fifth to seventh adhesive layers AL5 to AL7.

Although not illustrated, a second hole is formed in the second hole region HA2, and the second hole may be defined from the supporting plate PLT to a previous layer of the panel protecting layer PPL, in the same manner as the first hole H1. The camera CA described above may be disposed to overlap the first hole H1, and the sensor SN described above may be disposed to overlap the second hole.

Referring to FIGS. 7 and 8, the panel protecting layer PPL and the fourth adhesive layer AL4 may not be disposed under the bending region BA. The panel protecting layer PPL and the fourth adhesive layer AL4 may be disposed under the second region AA2 of the electronic panel EP. The data driving unit DDV may be disposed on the second region AA2 of the electronic panel EP.

A printed circuit board PCB may be connected to the second region AA2 of the electronic panel EP. The printed circuit board PCB may be connected to one side of the second region AA2. As the bending region BA may be bent, the second region AA2 may be disposed under the first region AA1. Accordingly, the data driving unit DDV and the printed circuit board PCB may be disposed under the first region AA1.

Figure 9:
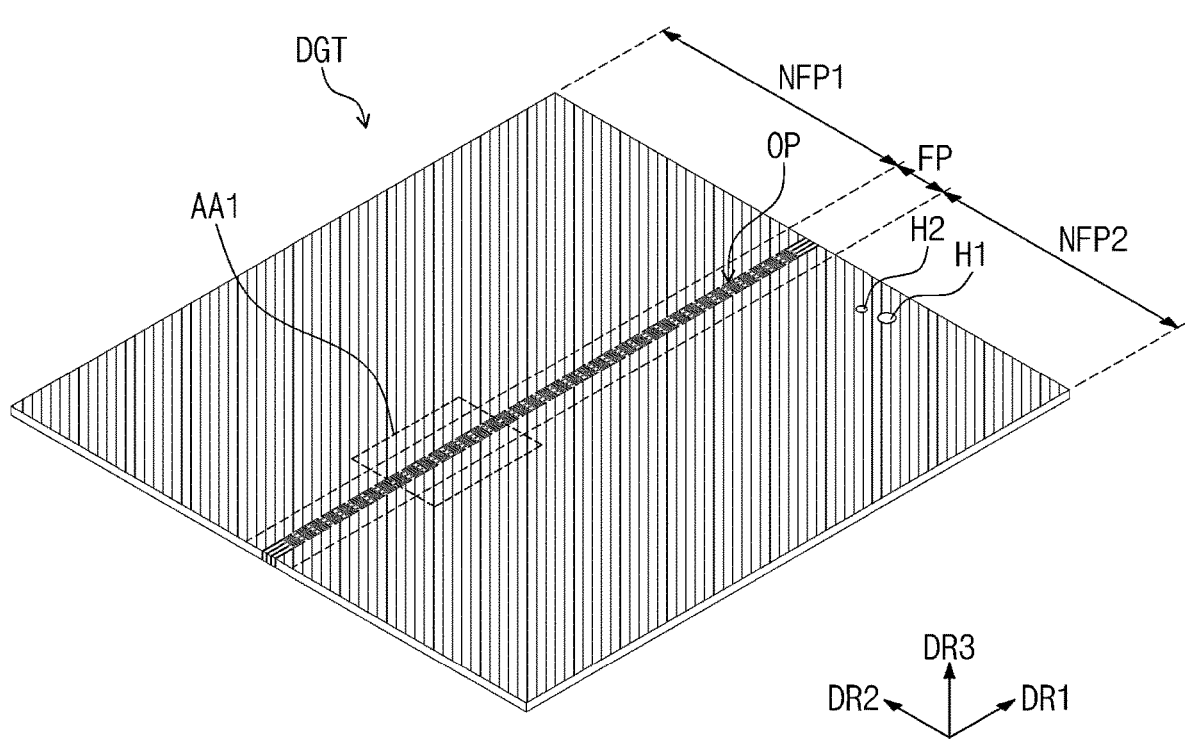
FIG. 9 is a perspective view of the digitizer illustrated in FIG. 7.

FIG. 9 is a perspective view of the digitizer illustrated in FIG. 7.

Referring to FIGS. 7 and 9, in an embodiment, the digitizer DGT is a first non-folding part NFP1, a folding part FP, and a second non-folding part NFP2 arranged in the second direction DR2. The first non-folding part NFP1, the folding part FP, and the second non-folding part NFP2 may overlap the first non-folding region NFA1, the folding region FA, and the second non-folding region NFA2, respectively.

A lattice pattern may be defined in the folding part FP. In an embodiment, for example, a plurality of openings OP may be defined in the folding part FP. The openings OP may be arranged by a specific rule or pattern. The openings OP may be arranged in a lattice form to form a lattice pattern in the folding part FP. The region provided with the openings OP may be smaller than the width of the folding part FP when viewed in the cross-sectional view.

As the openings OP are defined in the folding part FP, the region of the folding part FP is reduced, and thus the rigidity of the folding part FP may be reduced. Therefore, in such an embodiment where the openings OP are defined in the folding part FP, the flexibility of the folding part FP may be increased, as compared to a case where the openings OP are not defined in the folding part FP. Accordingly, the folding part FP may be more easily folded.

The first hole H1 and a second hole H2 described above may be defined in the second non-folding part NFP2. The first hole H1 and the second hole H2 may be adjacent to an edge of the second non-folding part NFP2.

Figure 10:
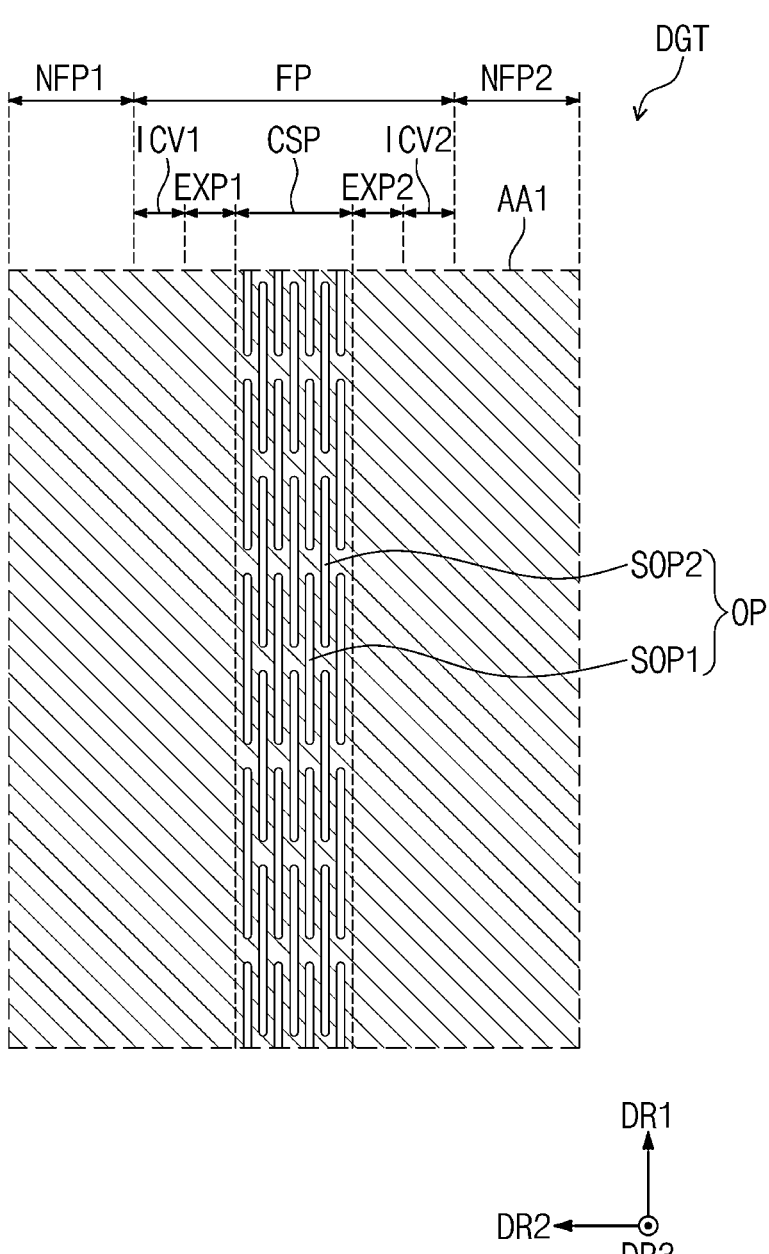
FIG. 10 is an enlarged plan view of a first region AA1 illustrated in FIG. 9.

FIG. 10 is an enlarged plan view of a first region AA1 illustrated in FIG. 9.

Referring to FIG. 10, in an embodiment, the folding part FP may include a curved surface part CSP, a first extending part EXP1, a second extending part EXP2, a first inverse curvature part ICV1, and a second inverse curvature part ICV2. The curved surface part CSP, the first extending part EXP1, the second extending part EXP2, the first inverse curvature part ICV1, and the second inverse curvature part ICV2 may be arranged in the second direction DR2.

In an embodiment, for example, the curved surface part CSP may be disposed at a central part of the folding part FP. The first inverse curvature part ICV1 may be defined as a portion of the folding part FP adjacent to the first non-folding part NFP1. The second inverse curvature part ICV2 may be defined as a portion of the folding part FP adjacent to the second non-folding part NFP2.

The curved surface part CSP may be interposed between the first extending part EXP1 and the second extending part EXP2. The first extending part EXP1 may be interposed between the first inverse curvature part ICV1 and the curved surface part CSP. The second extending part EXP2 may be interposed between the second inverse curvature part ICV2 and the curved surface part CSP.

The first inverse curvature part ICV1 may be interposed between the first non-folding part NFP1 and the first extending part EXP1. The second inverse curvature part ICV2 may be interposed between the second non-folding part NFP2 and the second extending part EXP2.

The openings OP may be defined in the curved surface part CSP. The openings OP may be arranged in the first direction DR1 and the second direction DR2. The openings OP may extend longer in the first direction DR1 than in the second direction DR2. The openings OP may extend in a direction parallel to the folding axis FX described above.

The openings OP may include first sub-opening parts SOP1 arranged in an h-th column and second sub-opening parts SOP2 arranged in an (h+1)-th column. Here, 'h' is a natural number. The column may correspond to the first direction DR1. The second sub-opening parts SOP2 may be adjacent to the first sub-opening parts SOP1 in the second direction DR2. The first sub-opening parts SOP1 may be disposed to be offset from the second sub-opening parts SOP2.

Figure 11:
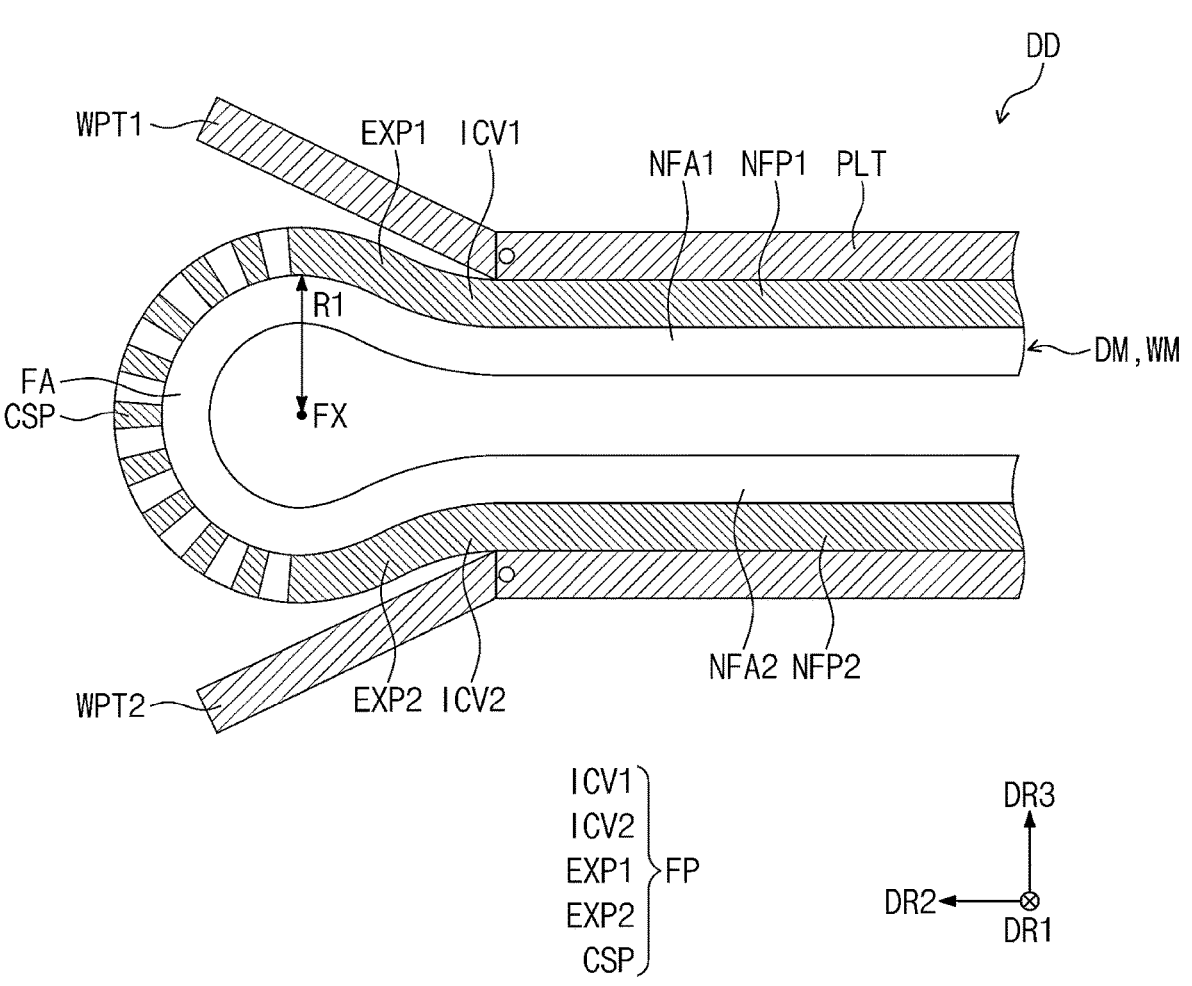
FIG. 11 is a view illustrating the display device illustrated in FIG. 7 in a folding state.

FIG. 11 is a view illustrating the display device illustrated in FIG. 7 in a folding (or folded) state.

For convenience of illustration and description, the bending region BA and the second region AA2 illustrated in FIG. 7 are omitted in FIG. 11. In addition, the display module DM and the window module WM are illustrated as being in a single-layer structure, and the adhesive layers AL6, AL7 and the cover layer COV are omitted in FIG. 11.

Referring to FIGS. 7 and 11, an embodiment of the display device DD may be in-folded with respect to the folding axis FX. The folding region FA may be bent such that the first non-folding region NFA1 and the second non-folding region NFA2 may face each other. The display device DD may be changed from a first state, which is a flat state illustrated in FIG. 7 to a second state which is a folding state illustrated in FIG. 11, or from the second state to the first state. Such a folding operation may be repeatedly performed.

Since the display module DM is a flexible display module, the folding region FA of the display module DM may be easily bent. Since the plurality of openings OP overlapping the folding region FA are defined in the digitizer DGT, the folding part FP may be easily bent due to the openings OP.

The digitizer DGT may be folded in the form of a dumbbell. When the folding part FP is folded, the curved surface part CSP may be bent to have a specific curvature. The curved surface part CSP may be bent to have a first radius of curvature R1.

The first inverse curvature part ICV1 may be bent inversely to the curved surface part CSP. The second inverse curvature part ICV2 may be bent in opposition to the curved surface part CSP. The second inverse curvature part ICV2 may have the shape symmetrical to the shape of the first inverse curvature part ICV1.

When the folding part FP is folded, the supporting plate PLT may be disposed on the bottom surfaces of the first and second non-folding parts NFP1 and NFP2, respectively, to maintain a flat state. The first and second non-folding regions NFA1 and NFA2 and the first and second non-folding parts NFP1 and NFP2 may maintain a flat shape by the supporting plate PLT.

When the folding part FP is folded, a distance between the first non-folding part NFP1 and the second non-folding part NFP2 in the third direction DR3 may be smaller than twice (for example, a diameter) of the first radius of curvature R1. According to this configuration, the digitizer DGT may be folded in the form of a dumbbell.

The display device DD may further include a first wing plate WPT1 and a second wing plate WPT2 in order for the digitizer DGT to be folded in the form of a dumbbell to maintain the form of the dumbbell. The first wing plate WPT1 may be disposed on the bottom surfaces of the first inverse curvature part ICV1 and the first extending part EXP1, and the second wing plate WPT2 may be disposed on the bottom surfaces of the second inverse curvature part ICV2 and the second extending part EXP2.

The first wing plate WPT1 and the second wing plate WPT2 may be pivotally coupled to the supporting plate PLT disposed on the bottom surfaces of the first non-folding part NFP1 and the second non-folding part NFP2. The first wing plate WPT1 and the second wing plate WPT2 rotate about the supporting plate PLT to form a specific angle with respect to the supporting plate PLT.

The first wing plate WPT1 may support the first inverse curvature part ICV1 and the first extending part EXP1. The second wing plate WPT2 may support the second inverse curvature part ICV2 and the second extending part EXP2.

Figure 12:
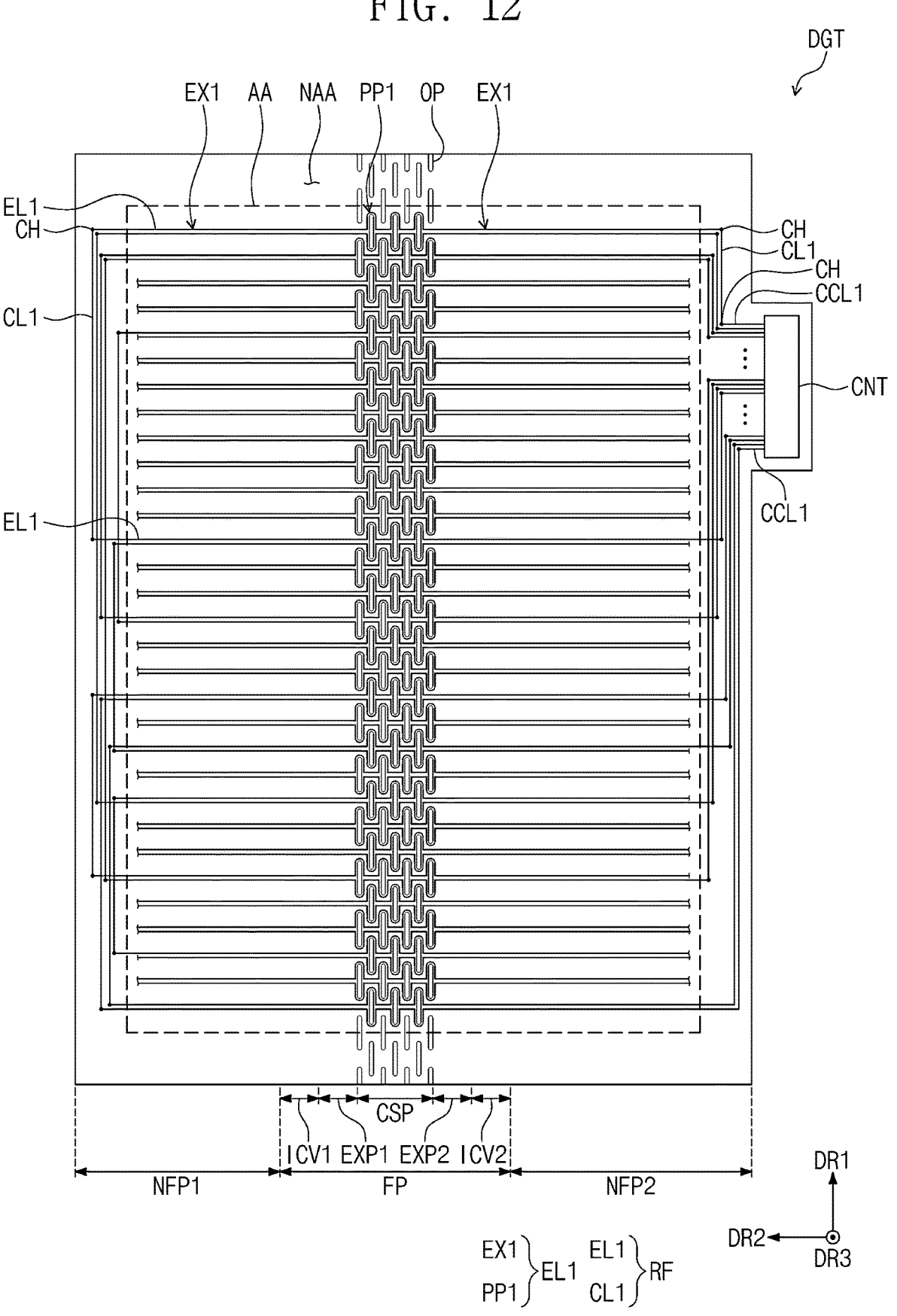
FIG. 12 is a view illustrating first sensing coils of the digitizer illustrated in FIG. 7.
Figure 13:
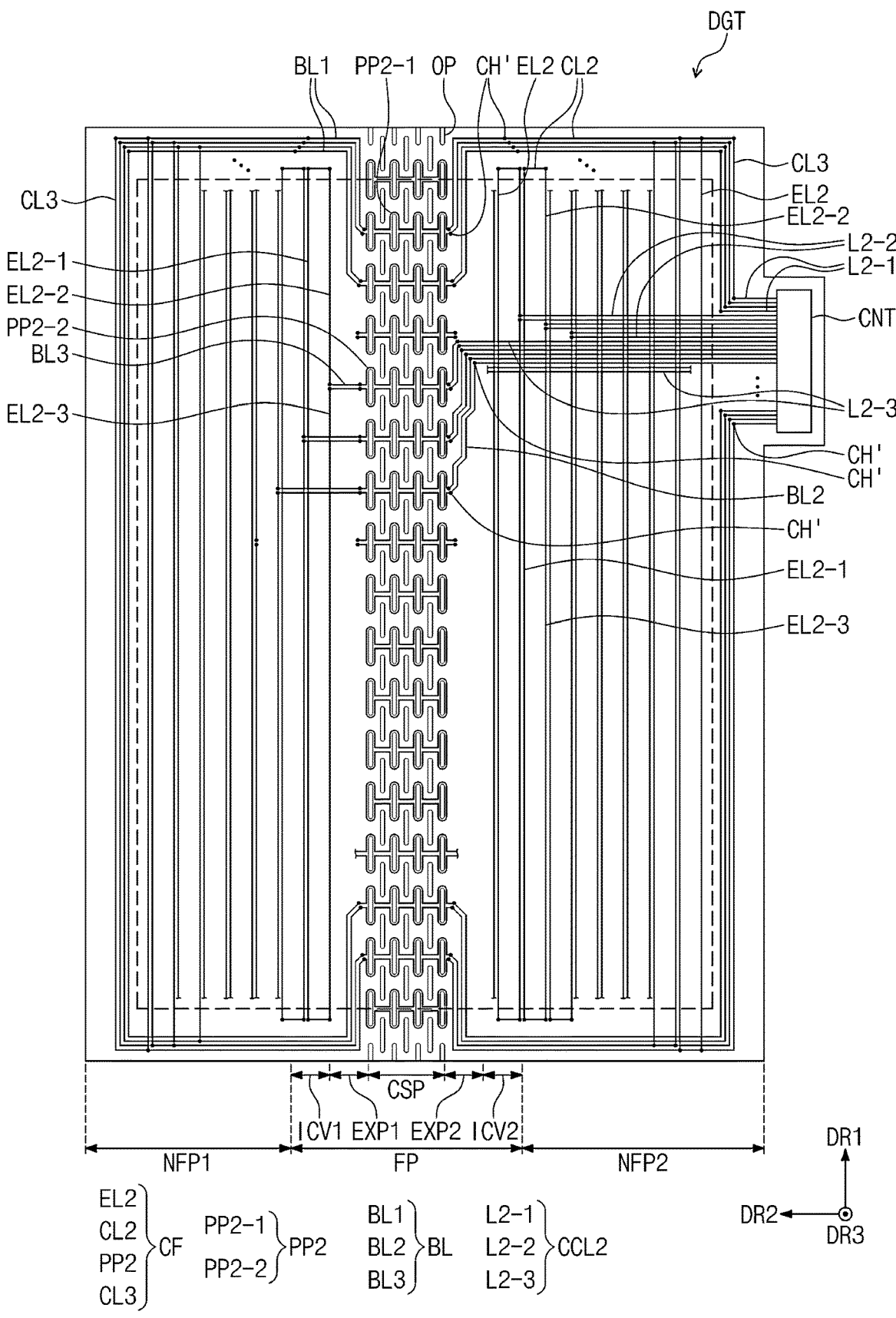
FIG. 13 is a view illustrating second sensing coils of the digitizer illustrated in FIG. 7.

FIG. 12 is a view illustrating first sensing coils of the digitizer illustrated in FIG. 7. FIG. 13 is a view illustrating second sensing coils of the digitizer illustrated in FIG. 7.

Particularly, FIGS. 12 and 13 are illustrated in plan views.

Particularly, the second non-folding part NFP2 is illustrated to be disposed on the right side of the first non-folding part NFP1.

Referring to FIG. 12, a region of the digitizer DGT may include an active region AA and a non-active region NAA around the active region AA when viewed in a plan view. The non-active region NAA may surround the active region AA. The active region AA may overlap the display region DA (see FIG. 1) described above, and the non-active region NAA may overlap the non-display region NDA (see FIG. 1) described above.

The digitizer DGT may include a connector CNT, a plurality of first connector connection lines CCL1, and a plurality of first sensing coils RF. The connector CNT may be disposed at one side of the digitizer DGT. In an embodiment, for example, the connector CNT may be disposed in the non-active region NAA on the right side. The connector CNT may be disposed in the second non-folding part NFP2.

The first connector connection lines CCL1 may be disposed in the right non-active region NAA. The first connector connection lines CCL1 may extend in the second direction DR2 and may be arranged in the first direction DR1 to be connected to the connector CNT. The first sensing coils RF may be connected to the connector CNT through the first connector connection lines CCL1.

The first sensing coils RF may be disposed in the non-active region NAA and the active region AA. The first sensing coils RF may extend from the second non-folding part NFP2 to the first non-folding part NFP1. The first sensing coils RF may extend through the openings OP in the active region AA. In an embodiment, for example, the first sensing coils RF may extend from the folding part FP through the openings OP. The first sensing coils RF may extend to be bent along the edges of the openings OP in the folding part FP.

The first sensing coils RF may extend from the connector CNT to form a loop form together with the first connector connection lines CCL1. In an embodiment, for example, the first sensing coils RF extending from the connector CNT may extend to the right non-active region NAA, the active region AA, and the left non-active region NAA, and then to the active region AA and the right non-active region NAA to be connected to the first connector connection lines CCL1.

In FIG. 12, some first sensing coils RF are illustrated in the form of a loop, and the remaining first sensing coils RF are illustrated as extending only in the second direction DR2 within the active region AA without being in the form of the loop. In FIG. 12, the first connection lines CL1 of the remaining first sensing coils RF are omitted for convenience of illustration, and the remaining first sensing coils RF may extend in the form of a loop.

Each of the first sensing coils RF may include a plurality of first extending lines EL1 and a plurality of first connection lines CL1. The first extending lines EL1 may be disposed in the active region AA to extend in the second direction DR2, and may be arranged in the first direction DR1. In an embodiment, for example, each of the first sensing coils RF may include a pair of first extending lines EL1, and the pair of first extending lines EL1 may extend parallel to each other in the second direction DR2.

The first extending lines EL1 of the first sensing coils RF may be disposed adjacent to each other in a pair in the active region AA to extend in parallel to each other in the second direction DR2. The first extending lines EL1 may extend and pass between the openings OP. The first extending lines EL1 may extend to be bent along edges of the openings OP in the folding part FP.

Lengths of the first extending lines EL1 may be different from lengths of the first connection lines CL1. In an embodiment, for example, the first extending lines EL1 may be longer than the first connection lines CL1, but embodiments of the disclosure are not limited thereto.

The first connection lines CL1 may be disposed in the non-active region NAA and extend in the first direction DR1. In an embodiment, for example, the first connection lines CL1 may be disposed in the non-active regions NAA at the left side and the right side. The first connection lines CL1 may be connected to the first extending lines EL1. In an embodiment, for example, the first connection lines CL1 of each of the first sensing coils RF may be connected to opposite end portions of the first extending lines EL1 of each of the first sensing coils RF.

The first extending lines EL1 may be disposed in a layer different from the first connection lines CL1. In an embodiment, for example, the first connection lines CL1 may be disposed below the first extending lines EL1. The first connection lines CL1 may be connected to the first extending lines EL1 through contact holes CH. Such a stacking structure will be described later in greater detail.

The first connector connection lines CCL1 may be connected to the first connection lines CL1 disposed in the non-active region NAA at the right side. The first connector connection lines CCL1 may be disposed in a layer the same as the first extending lines EL1 and may be disposed in a layer different from that of the first connection lines CL1. The first connection lines CL1 may be disposed below the first connector connection lines CCL1. The first connection lines CL1 may be connected to the first connector connection lines CCL1 through the contact holes CH.

Each of the first extending lines EL1 may include first extending lines EX1 disposed in the first and second non-folding parts NFP1 and NFP2, respectively, and a first pattern part PP1 disposed in the curved surface part CSP of the folding part FP. The first extending lines EX1 may extend to the first and second inverse curvature parts ICV1 and ICV2 and the first and second extending parts EXP1 and EXP2.

The first pattern part PP1 may extend through the openings OP. The first pattern part PP1 may extend from the folding part FP to be curved along edges of the openings OP. The first pattern part PP1 may extend from the first extending lines EX1. In an embodiment of the disclosure, the first pattern part PP1 may be integrally formed with the first extending lines EX1 as a single unitary and indivisible part.

Referring to FIGS. 12 and 13, the digitizer DGT may include a plurality of second sensing coils CF, a plurality of bridge lines BL, and a plurality of second connector connection lines CCL2.

The second sensing coils CF may be connected to the second connector connection lines CCL2, and the second connector connection lines CCL2 may be connected to the connector CNT. The second sensing coils CF may be connected to the connector CNT through second connector connection lines CCL2. The bridge lines BL may be connected to the second sensing coils CF. The second sensing coils CF may extend from the connector CNT to form a loop together with the second connector connection lines CCL2.

In FIG. 13, some second sensing coils CF are illustrated in the form of a loop, and the remaining second sensing coils CF are illustrated as extending only in the first direction DR1 within the active region AA without being in the form of the loop. In FIG. 13, the second connection lines CL2 of the remaining second sensing coils CF are omitted for convenience of illustration, and even the remaining second sensing coils CF may extend in the form of a loop.

The bridge lines BL may be disposed below the second sensing coils CF. The bridge lines BL may include a plurality of first bridge lines BL1, a plurality of second bridge lines BL2, and a plurality of third bridge lines BL3. In FIG. 13, some first bridge lines BL1, some second bridge lines BL2, and some third bridge lines BL3 are omitted for convenience of illustration.

The first bridge lines BL1 may be adjacent to the upper and lower sides of the digitizer DGT. The second bridge lines BL2 and the third bridge lines BL3 may be interposed between the first bridge lines BL1 adjacent to the upper side of the digitizer DGT and the first bridge lines BL1 adjacent to the lower side of the digitizer DGT.

The first bridge lines BL1 may be adjacent to the openings OP. The first bridge lines BL1 may be interposed between the first non-folding part NFP1 and the curved surface part CSP, and between the second non-folding part NFP2 and the curved surface part CSP.

The second and third bridge lines BL2 and BL3 may be adjacent to the openings OP. The second bridge lines BL2 may be interposed between the second non-folding part NFP2 and the curved surface part CSP. The third bridge lines BL3 may be interposed between the first non-folding part NFP1 and the curved surface part CSP. Some third bridge lines BL3 may extend to the first non-folding part NFP1.

The second sensing coils CF may include a plurality of second extending lines EL2, a plurality of second connection lines CL2, a plurality of second pattern parts PP2, and a plurality of third connection lines CL3.

The second extending lines EL2 may be disposed in the active region AA to extend in the first direction DR1, and may be arranged in the second direction DR2. The second extending lines EL2 may be disposed in the first and second non-folding parts NFP1 and NFP2. The second extending lines EL2 may be disposed in the first and second extending parts EXP1 and EXP2 and the first and second inverse curvature parts ICV1 and ICV2. In the active region AA, the second extending lines EL2 may be disposed adjacent to each other in a pair form and may extend parallel to each other in the first direction DR1.

The second extending lines EL2 may be disposed below the first extending lines EL1. In other words, in the active region AA, the second sensing coils CF may be disposed under the first sensing coils RF. The second extending lines EL2 may be disposed in a same layer as the first connection lines CL1.

The second connection lines CL2 may be disposed in the non-active region NAA and extend in the second direction DR2. In an embodiment, for example, the second connection lines CL2 may be disposed in the upper and lower non-active regions NAA. The second connection lines CL2 may be disposed in a same layer as the first extending lines EL1.

The second connection lines CL2 may be connected to opposite terminals of the second extending lines EL2 through contact holes CH'. Some of the second connection lines CL2 may be connected to the first bridge lines BL1 through contact holes CH'.

The second pattern parts PP2 may be disposed in the curved surface part CSP of the folding part FP. The second pattern parts PP2 may extend through the openings OP. The second pattern parts PP2 may extend to be bent along edges of the openings OP. The second pattern parts PP2 may be connected to the first, second, and third bridge lines BL1, BL2, and BL3 through the contact hole CH'. The second pattern parts PP2 may be disposed in a same layer as the second extending lines EL2. The second pattern parts PP2 may be disposed below the first pattern parts PP1.

The second pattern parts PP2 may include first second pattern parts (hereinafter, will be referred to as "(2–1)-th pattern parts") PP2-1 connected to the first bridge lines BL1 and second second pattern parts (hereinafter, will be referred to as "(2–2)-th pattern parts") PP2-2 connected to the second bridge line BL2 and the third bridge line BL3. Some second connection lines CL2 disposed in the first non-folding part NFP1 and some second connection lines CL2 disposed in the second non-folding part NFP2 may be connected to each other through the first bridge lines BL1 and the (2–1)-th pattern parts PP2-1.

The second connector connection lines CCL2 may be connected to the connector CNT and extend in the second direction DR2. The second connector connection lines CCL2 may be disposed in a same layer as the first extending lines EL1 described above. Some of the second connector connection lines CCL2 may be connected to the second connection lines CL2, and others of the second connector connection lines CCL2 may extend to the active region AA to be connected to some second extending lines EL2.

The second connector connection lines CCL2 may include a plurality of first second lines (hereinafter will be referred to as "(2–1)-th lines") L2-1, a plurality of second second lines (hereinafter will be referred to as "(2–2)-th lines") L2-2 and a plurality of third second lines (hereinafter will be referred to as "(2–3)-th lines") L2-3. The (2–1)-th lines L2-1 may be disposed in the non-active region NAA at the right side. The (2–1)-th lines L2-1 may be connected to the third connection lines CL3 through the contact holes CH'. The (2–1)-th lines L2-1 may be connected to the second connection lines CL2 through the third connection lines CL3.

The (2–2)-th lines L2-2 may be disposed in the second non-folding part NFP2. The (2–2)-th lines L2-2 may extend to the active region AA and may be connected to some second extending lines EL2 through the contact holes CH'. The (2–2)-th lines L2-2 may be connected to some second extending lines EL2 disposed in the active region AA. The (2–2)-th lines L2-2 may be connected to the second extending lines EL2 to form a loop form together with the second extending lines EL2.

Each of some second extending lines EL2 of the second extending lines EL2 may include a first second extending line (hereinafter will be referred to as "(2–1)-th extending line") EL2-1, a second second extending line (hereinafter will be referred to as "(2–2)-th extending line") EL2-2 and a third second extending line (hereinafter will be referred to as "(2–3)-th extending line") EL2-3. The (2–1)-th extending line EL2-1 may extend in the first direction DR1 and may be connected to terminals of a pair of corresponding second connection lines CL2 through contact holes CH'.

The (2–2)-th extending line EL2-2 and the (2–3)-th extending line EL2-3 may extend in the first direction DR1 and may be connected to opposite terminals of the pair of relevant second connection lines CL2 through the contact holes CH'. In the active region AA, the (2–2)-th extending line EL2-2 and the (2–3)-th extending line EL2-3 may be connected to a pair of relevant (2–2)-th lines L2-2 through the contact holes CH', respectively.

The (2–3)-th lines L2-3 may be disposed in the second non-folding part NFP2. The (2–3)-th lines L2-3 may extend to the active region AA. The (2–3)-th lines L2-3 may be connected to the second bridge lines BL2 through the contact holes CH' in the active region AA. The second bridge lines BL2 may be connected to the (2–2)-th pattern parts PP2-2 through contact holes CH'. A pair of (2–3)-th lines L2-3 may be connected to a pair of relevant second bridge lines BL2.

The (2–2)-th pattern parts PP2-2 may be connected to a part of the second extension lines EL2-2 disposed in the first non-folding part NFP1 through contact holes CH'. In an embodiment, for example, the (2–2)-th pattern parts PP2-2 and 2-3 extending lines EL2-2 and EL2-3 of each of the second extending lines EL2 disposed in the first non-folding part NFP1 may be connected to a pair of corresponding (2–2)-th pattern parts PP2-2.

The pair of (2–2)-th pattern parts PP2-2 may be connected to the (2–2)-th extending line EL2-2 and the (2–3)-th extending line EL2-3 through a pair of corresponding third bridge lines BL3. In an embodiment, for example, the third bridge lines BL3 may be interposed between the terminals of the (2–2)-th pattern parts PP2-2 and the (2–2)-th extending line EL2-2 and the (2–3)-th extending line EL2-3.

The (2–2)-th pattern parts PP2-2 may be connected to the third bridge lines BL3 through contact holes CH'. The third bridge lines BL3 may be connected to the (2–2)-th extending line EL2-2 and the (2–3)-th extending line EL2-3 through the contact holes CH'.

Therefore, each of the second extending lines EL2 disposed in the first non-folding part NFP1 may be connected to a pair of relevant (or corresponding) second bridge lines BL2 through a pair of relevant third bridge lines BL3 and a pair of relevant (2–2)-th pattern parts PP2-2. According to this connection, the second extending lines EL2, the third bridge lines BL3, the (2–2)-th pattern parts PP2-2, the second bridge lines BL2, and the (2–3)-th lines L2-3 may be connected to form a loop form.

The third connection lines CL3 may be disposed in the non-active region NAA and extend in the first direction DR1. The third connection lines CL3 may be disposed in the non-active regions NAA at left and right sides.

The third connection lines CL3 disposed in the non-active region NAA at the right side may be connected to the second connection lines CL2 and the (2–1)-th lines L2-1 disposed in the second non-folding part NFP2 through the contact holes CH'. The third connection lines CL3 disposed in the non-active region NAA at the left side may be connected to the second connection lines CL2 disposed in the first non-folding part NFP1 through the contact holes CH'.

According to the structure, the second sensing coils CF may extend from the connector CNT to have a coil shape.

According to an embodiment of the disclosure, the second sensing coils CF may be defined as driving coils, and the first sensing coils RF may be defined as sensing coils, but the disclosure is not limited thereto and may be vice versa. When a current flows through the second sensing coils CF, a magnetic field line may be induced between the second sensing coils CF and the first sensing coils RF. The first sensing coils RF may sense the induced electromagnetic force applied from the electromagnetic pen and output the electromagnetic force to one terminal of each of the first sensing coils RF while serving as a sensing signal.

Figure 14:
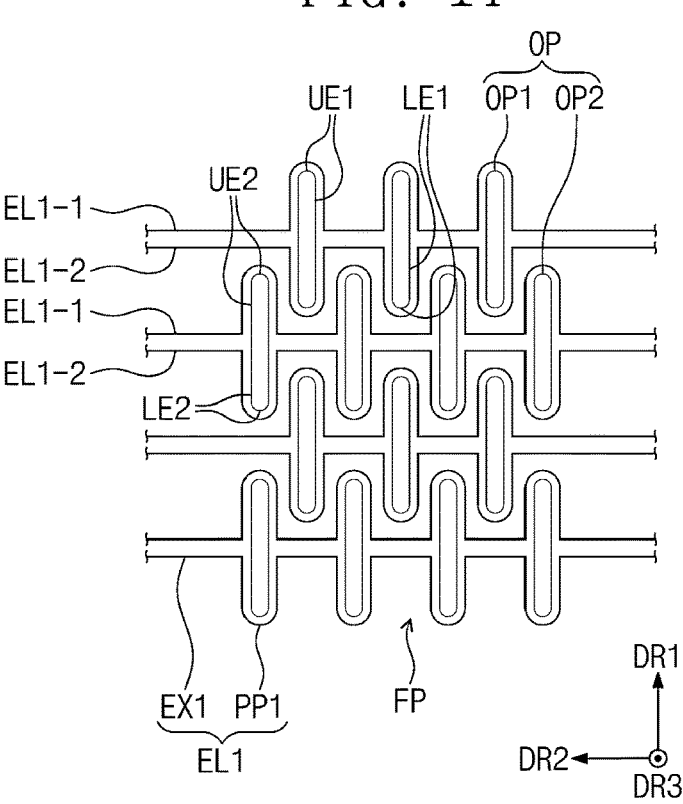
FIG. 14 is an enlarged view of a portion of the folding part illustrated in FIG. 12.

FIG. 14 is an enlarged view of a portion of the folding part illustrated in FIG. 12.

Referring to FIG. 14, in an embodiment, the openings OP may include first openings OP1 arranged in a k-th row and second openings OP2 arranged in a (k+1)-th row. Here, 'k' is a natural number. The first openings OP1 and the second openings OP2 may be disposed to be offset from each other. The row may correspond to the second direction DR2.

In an embodiment, for example, the number of first openings OP1 may be smaller than the number of second openings OP2 based on the second direction DR2, but an embodiment of the disclosure is not limited thereto.

The first extending lines EL1 may extend through the first openings OP1 and the second openings OP2. The first extending lines EL1 may extend along edges of the first openings OP1 and edges of the second openings OP2.

The first extending lines EL1 may be bent and extended to have a shape corresponding to the edges of the first openings OP1 and the edges of the second openings OP2. In an embodiment, for example, the first pattern parts PP1 may be bent and extended between the first openings OP1 and the second openings OP2 to have a shape corresponding to the edges of the first openings OP1 and the second openings OP2.

The first extending lines EL1 may extend along an upper edge UE1 and a lower edge LE1 to be adjacent to the upper edge UE1 and the lower edge LE1 of each of the first openings OP1. In addition, the first extending lines EL1 may extend along an upper edge UE2 and a lower edge LE2 to be adjacent to the upper and lower edges UE2 and LE2 of each of the second openings OP2.

According to an embodiment of the disclosure, each of the upper edges UE1 and UE2, when viewed from a plan view, may be defined as an edge of each part of the openings OP formed above the center of each of the openings OP based on the first direction DR1. In addition, each of the lower edges LE1 and LE2 may be defined as the edge of each part of the opening OP formed below the center of each of the openings OP based on the first direction DR1 when viewed from a plane.

Among the first extending lines EL1, each pair of first extending lines EL1 adjacent to each other may be defined as a first first extending line (hereinafter, will be referred to as "(1–1)-th extending line") EL1-1 and a second first extending line (hereinafter, will be referred to as "(1–2)-th extending line") EL1-2. The (1–1)-th extending line EL1-1 of each pair of first extending lines EL1 may extend along the upper edge UE1 of each of the first openings OP1 and the upper edge UE2 of each of the second openings OP2 in the folding part FP. The (1–2)-th extending lines EL1-2 of each pair of first extending lines EL1 may extend in the folding part FP along the lower edge LE1 of each of the first openings OP1 and the lower edge LE2 of each of the second openings OP2.

Therefore, the first pattern parts PP1 may extend along the upper edge UE1 and the lower edge LE1 to be adjacent to the upper edge UE1 and the lower edge LE1 of each of the first openings OP1. In addition, the first pattern parts PP1 may extend along the upper and lower edges UE2 and LE2 to be adjacent to the upper and lower edges UE2 and LE2 of each of the second openings OP2.

Figure 15:
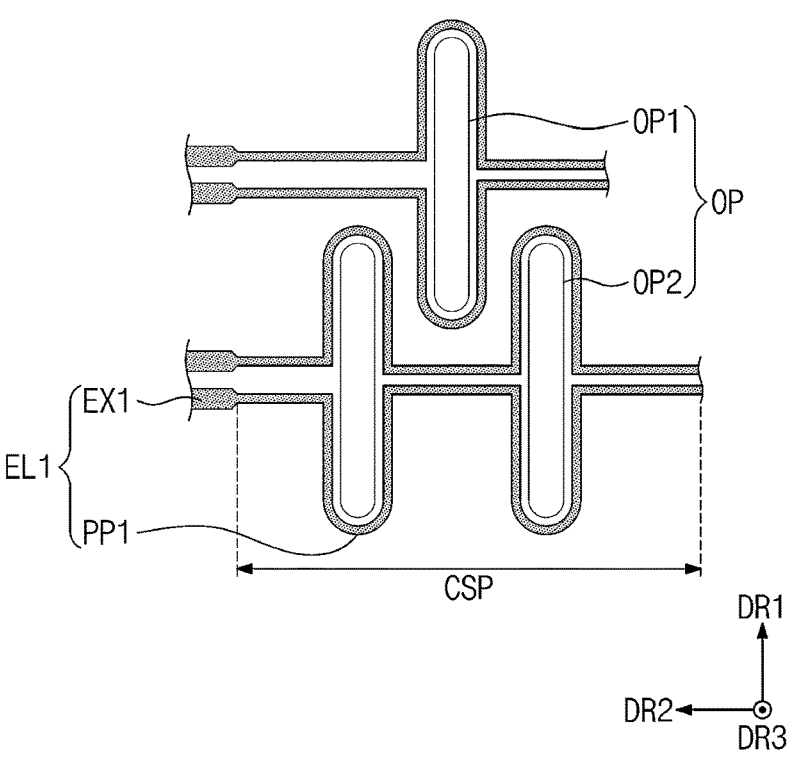
FIG. 15 is an enlarged view of some first extending lines illustrated in FIG. 14.

FIG. 15 is an enlarged view of some first extending lines illustrated in FIG. 14.

Referring to FIG. 15, a width of each of the first extending lines EX1 may be greater than a width of each of the first pattern parts PP1 disposed in the curved surface part CSP. Since the area between the openings OP is limited, widths of the first extending lines EL1 may be reduced between openings OP such that the first extending lines EL1 pass through the openings OP.

Figure 16:
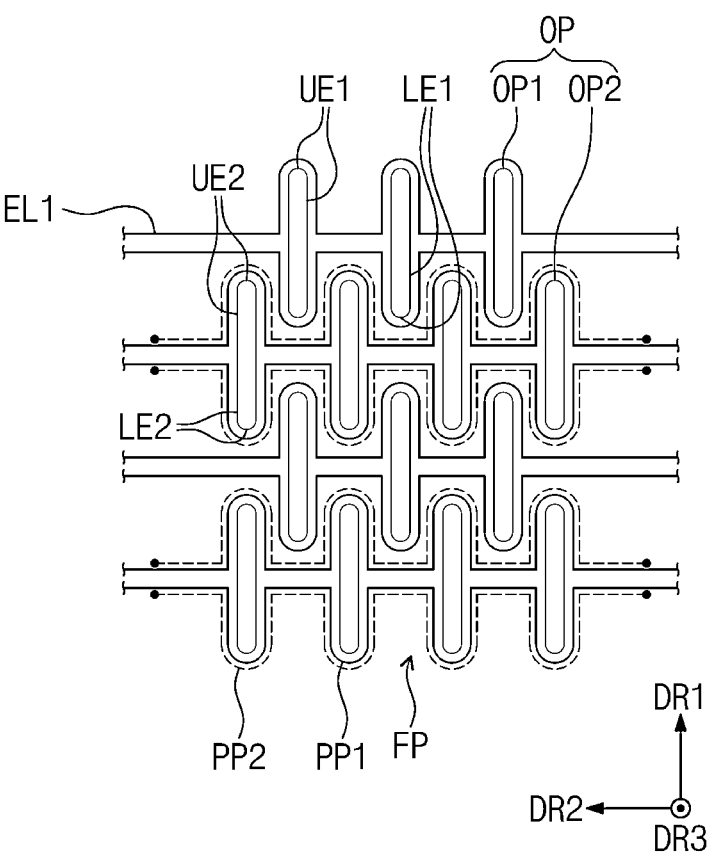
FIG. 16 is a view illustrating the second pattern parts illustrated in FIG. 13 added to the first pattern parts illustrated in FIG. 14.

FIG. 16 is a view illustrating the second pattern parts illustrated in FIG. 13 added to the first pattern parts illustrated in FIG. 14.

Particularly, in FIG. 16, the second pattern parts PP2 are shown in a dotted line Referring to FIG. 16, in an embodiment, the second pattern parts PP2 may extend along the upper edge UE2 and the lower edge LE2 while being adjacent to the upper edge UE2 and the lower edge LE2 of each of the second openings OP2. The second pattern parts PP2 may not extend along the upper edge UE1 and the lower edge LE1 of the first openings OP1. In other words, the second pattern parts PP2 may not be disposed around the upper edge UE1 and the lower edge LE1 of the first openings OP1.

The second pattern parts PP2 may not be disposed under the first pattern parts PP1, which extend along the edges of the first openings OP1, among the first pattern parts PP1. The second pattern parts PP2 may be disposed under the first pattern parts PP1, which extend along edges of the second openings OP2, of the first pattern parts PP1.

In FIG. 16, the second pattern parts PP2 are illustrated to be spaced apart from the first pattern parts PP1 to distinguish between the second pattern parts PP2 and the first pattern parts PP1. However, in an embodiment, when viewed in a plan view, the second pattern parts PP2 may be arranged to overlap the first pattern parts PP1 extending along the edges of the second openings OP2.

Figure 17:
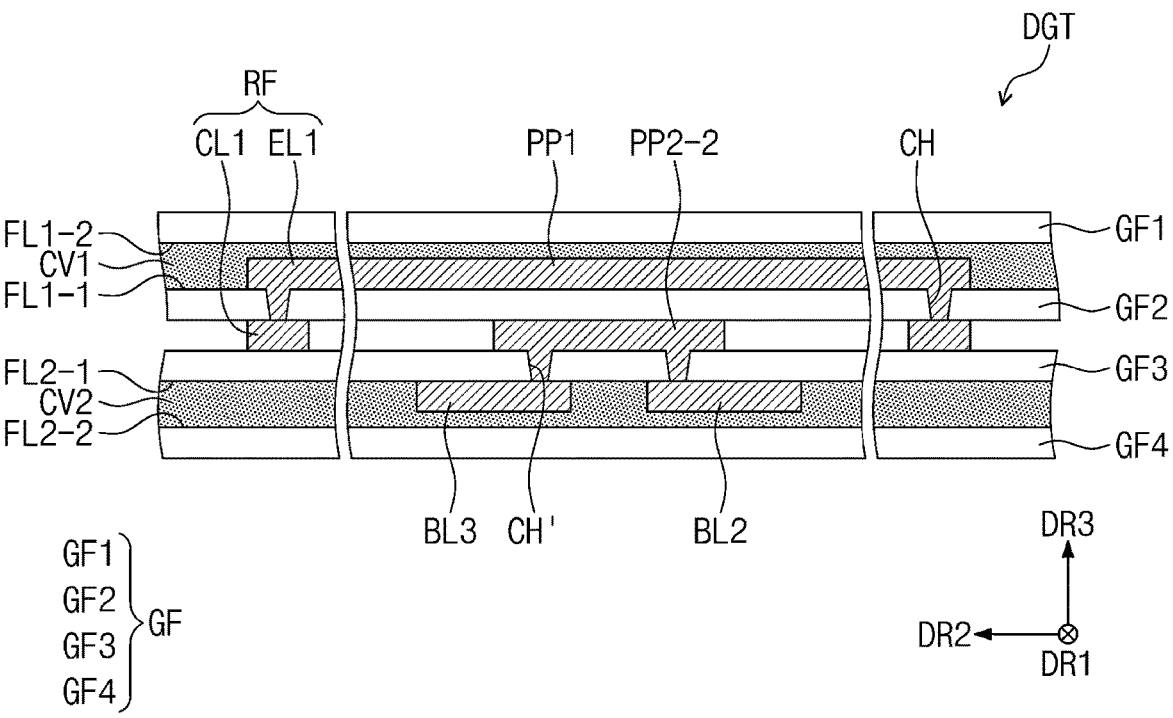
FIG. 17 is a cross-sectional view of a digitizer illustrated in FIG. 9.
Figure 18:
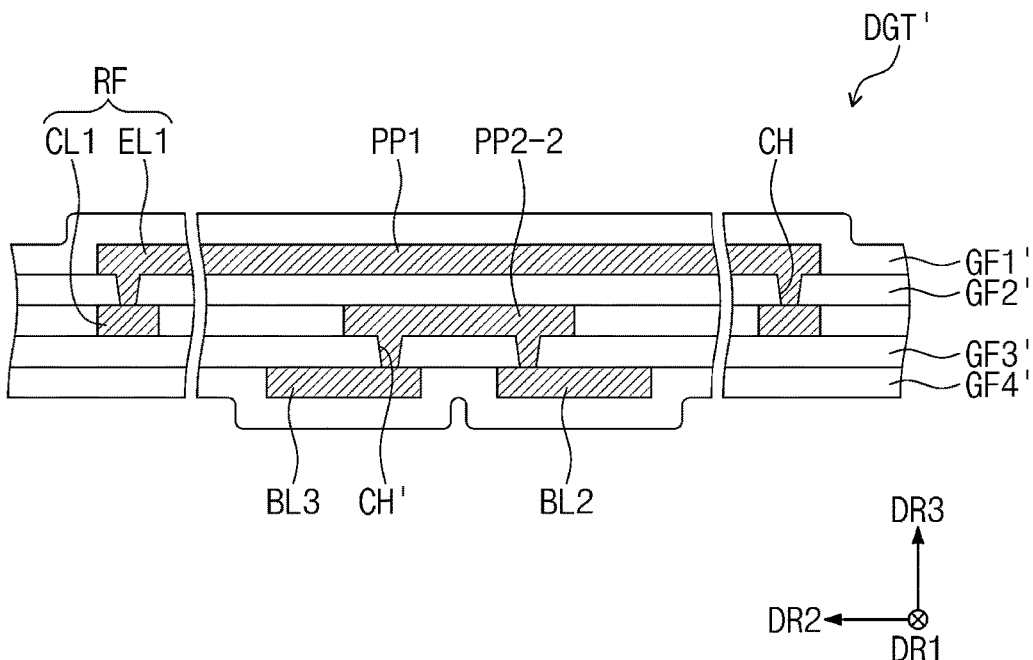
FIG. 18 is a cross-sectional view of a digitizer according to a comparative embodiment.

FIG. 17 is a cross-sectional view of a digitizer illustrated in FIG. 9. FIG. 18 is a cross-sectional view of a digitizer according to a comparative embodiment.

The first sensing coil RF, the (2–2)-th pattern part PP2-2, the second bridge line BL2, and the third bridge line BL3 illustrated in FIGS. 17 and 18 are the same as the first sensing coil RF illustrated in FIG. 12, the (2–2)-th pattern part PP2-2, the second bridge line BL2, and the third bridge line BL3 illustrated in FIG. 13. Accordingly, any repetitive detailed description thereof will be omitted or briefly described.

Referring to FIG. 17, an embodiment of the digitizer DGT may include a first support layer GF1, a second support layer GF2, a third support layer GF3, and a fourth support layer GF4, which are sequentially stacked one on another from the top to the bottom. In an embodiment, for example, the digitizer DGT may include four support layers GF1 to GF4 as shown in FIG. 17, but the disclosure is not limited thereto.

In an embodiment, for example, the first support layer GF1 to the fourth support layer GF4 may have a same thickness as each other. However, the disclosure is not limited thereto, and at least two support layers among the first to fourth support layers GF1 to GF4 may have mutually different thicknesses.

In an embodiment, for example, the first to fourth support layers GF1 to GF4 may include glass fiber reinforced plastic (GFRP). However, the disclosure is not limited thereto. In an embodiment, for example, the first to fourth support layers GF1 to GF4 may include carbon fiber reinforced plastic (CFRP) or aramid fiber reinforced plastic (AFRP).

The first extending lines EL1 may be disposed under the first support layer GF1. The second support layer GF2 may be disposed under the first extending lines EL1. The first extending lines EL1 may be disposed on the top surface of the second support layer GF2.

The first connection lines CL1 may be disposed under the second support layer GF2. The third support layer GF3 may be disposed under the first connection lines CL1. In other words, the first connection lines CL1 may be interposed between the second support layer GF2 and the third support layer GF3.

The first connection lines CL1 may be connected to the first extending lines EL1 through contact holes CH defined by the second support layer GF2.

The (2–2)-th pattern part PP2-2 may be disposed under the second support layer GF2. The (2–2)-th pattern part PP2-2 may be disposed on the third support layer GF3. In other words, the (2–2)-th pattern part PP2-2 may be interposed between the second support layer GF2 and the third support layer GF3.

The second bridge line BL2 and the third bridge line BL3 may be disposed under the third support layer GF3. The second bridge line BL2 and the third bridge line BL3 may be disposed on the bottom surface of the third support layer GF3. The second bridge line BL2 and the third bridge line BL3 may be disposed on the fourth support layer GF4. The fourth support layer GF4 may be disposed under the second bridge line BL2 and the third bridge line BL3. In other words, the second bridge line BL2 and the third bridge line BL3 may be interposed between the third support layer GF3 and the fourth support layer GF4.

Each of the second bridge line BL2 and the third bridge line BL3 may be connected to the (2–2)-th pattern part PP2-2 through a corresponding contact hole CH' among the contact holes CH' defined by the third support layer GF3.

The digitizer DGT may further include a first compensating layer CV1 and a second compensating layer CV2. The first compensating layer CV1 may be disposed under the first support layer GF1. The first compensating layer CV1 may be disposed on the second support layer GF2. The first compensating layer CV1 may be disposed on the first extending line EL1. The first compensating layer CV1 may be disposed on the second support layer GF2 to cover the first extending line EL1.

The first compensating layer CV1 may have a flat top surface. The first support layer GF1 may be disposed on the flat top surface of the first compensating layer CV1. The top surface of the first compensating layer CV1 may be defined as a surface opposite to the bottom surface covering the first extending line EL1 in the third direction DR3. The bottom surface of the first compensating layer CV1 may be defined as a first first surface (hereinafter, will be referred to as "(1–1)-th surface") FL1-1. The top surface of the first compensating layer CV1 may be defined as a second first surface (hereinafter, will be referred to as "(1–2)-th surface") FL1-2.

The second compensating layer CV2 may be disposed under the third support layer GF3. The second compensating layer CV2 may be disposed on the fourth support layer GF4. The second compensating layer CV2 may be disposed on the bottom surface of the third support layer GF3 to cover the second bridge line BL2 and the third bridge line BL3.

The second compensating layer CV2 may be a flat bottom surface. A fourth support layer GF4 may be disposed on the flat bottom surface of the second compensating layer CV2. The shape of the bottom surface of the second compensating layer CV2 may be symmetrical to the shape of the top surface of the first compensating layer CV1 in the third direction DR3. The bottom surface of the second compensating layer CV2 may be defined as a surface opposite to the top surface covering the second bridge line BL2 and the third bridge line BL3 in the third direction DR3. Hereinafter, the top surface of the second compensating layer CV2 may be defined as a first second surface (hereinafter, will be referred to as "(2–1)-th surface") FL2-1, and the bottom surface of the second compensating layer CV2 may be defined as a second second surface (hereinafter, will be referred to as "(2–2)-th surface") FL2-2.

The first compensating layer CV1 and the second compensating layer CV2 may have a thickness in a range of about 25 micrometers (μm) to about 74 μm. In an embodiment, for example, the first compensating layer CV1 and the second compensating layer CV2 may have a thickness as each other. However, the disclosure is not limited thereto. A difference between the thickness of the first compensating layer CV1 and the thickness of the second compensating layer CV2 will be described in detail with reference to FIG. 19.

Referring to FIG. 18, in a process of manufacturing a digitizer DGT' where the first compensating layer CV1 and the second compensating layer CV2 are not provided, after the first extending line EL1 is disposed on a second support layer GF2', a first support layer GF1' may be deposited. In this case, due to the first extending line EL1, the first support layer GF1' may not be the flat top surface. In detail, the top surface of the portion of the first support layer GF1' overlapping the first extending line EL1 and the top surface of the portion of the first support layer GF1' not overlapping the first extending line EL1 may be stepped on each other. In addition, due to the second bridge line BL2 and the third bridge line BL3, the bottom surface of the fourth support layer GF4' may not be flat.

Accordingly, the top surface of the display module DM (see FIG. 7) and the top surface of the window module WM (see FIG. 7) attached to the digitizer DGT' may not be flat. Accordingly, the surface quality of the display device DD (see FIG. 1) may be deteriorated.

In an embodiment of the disclosure, referring to FIG. 17, the first compensating layer CV1 may cover the first extending line EL1 and provide a flat top surface. The first support layer GF1 may be disposed on the top surface of the flat first compensating layer CV1. Accordingly, since the first support layer GF1 has the flat top surface, the digitizer DGT may have a flat top surface. The display module DM (see FIG. 7) attached to the digitizer DGT may have a flat top surface and a top surface of the window module WM may have a flat top surface. Accordingly, the surface quality of the display device DD (see FIG. 1) may be improved.

In such an embodiment, as the second compensating layer CV2 is disposed, the first support layer GF1 to the fourth support layer GF4, the first compensating layer CV1 and the second compensating layer CV2 may be symmetrical to each other about an axis parallel to the second direction DR2 while passing through the center of the (2–2)-th pattern part PP2-2. Accordingly, the phenomenon, in which the first to fourth support layers GF1 to GF4, the first sensing coil RF, the bridge lines BL, and the second sensing coil CF are curled, may be effectively prevented. Accordingly, the reliability of the display device DD (see FIG. 1) may be improved.

The first compensating layer CV1 and the second compensating layer CV2 may include epoxy resin. In an embodiment, for example, the first compensating layer CV1 and the second compensating layer CV2 may be a compound having heat resistance at 150 degrees to 250 degrees. In addition, the shapes of the first compensating layer CV1 and the second compensating layer CV2 may be modified by applying a pressure of 5 Bar to 100 Bar to the first compensating layer CV1 and the second compensating layer CV2 to cover the first extending line EL1, the second bridge line BL2, and the third bridge line BL3.

Figure 19:
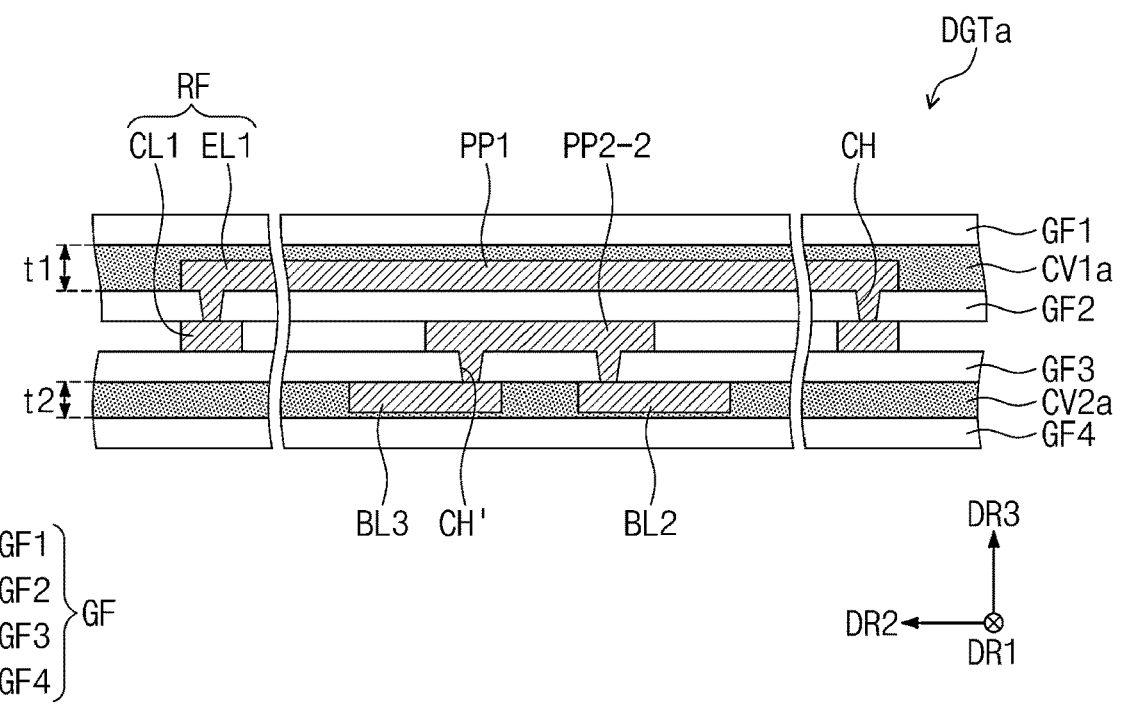
FIG. 19 is a view illustrating a digitizer according to another embodiment of the disclosure.

FIG. 19 is a view illustrating a digitizer according to another embodiment of the disclosure.

The first to fourth support layers GF1 to GF4, the first sensing coil RF, the (2–2)-th pattern part PP2-2, the second bridge line BL2, and the third bridge line BL3 of FIG. 19 are the same as the first to fourth support layers GF1 to GF4, the first sensing coil RF, the (2–2)-th pattern part PP2-2, the second bridge line BL2, and the third bridge line BL3 of FIG. 17, and thus any repetitive detailed description thereof will be omitted or simplified to avoid redundancy.

In an embodiment, the digitizer DGTa may include a first compensating layer CV1a and a second compensating layer CV2a. The first compensating layer CV1a may be disposed on the top surface of the second support layer GF2 to cover the first extending line EL1. The second compensating layer CV2a may be disposed on the bottom surface of the third support layer GF3 to cover the second bridge line BL2 and the third bridge line BL3.

Accordingly, as the first support layer GF1 is disposed on the top surface of the flat first compensating layer CV1a and the fourth support layer GF4 is disposed on the flat bottom surface of the second compensating layer CV2a, the digitizer DGTa may be flat top and bottom surfaces. Accordingly, the surface quality of the display device DD (FIG. 1) may be improved.

Each of the first compensating layer CV1a and the second compensating layer CV2a may have a thickness in a range of about 25 μm to about 74 μm. In an embodiment, the thickness of the first compensating layer CV1a may be different from the thickness of the second compensating layer CV2a.

In an embodiment, for example, a first thickness t1 defined by the thickness of the first compensating layer CV1a may be greater than a second thickness t2 defined by the thickness of the second compensating layer CV2a. In such an embodiment, a relative deviation between the first thickness t1 of the first compensating layer CV1a and the second thickness t2 of the second compensating layer CV2a (i.e., a ratio of a difference between the first thickness t1 and the second thickness t2 with respect to an average of the first thickness t1 and the second thickness t2) may be in a range of about 1% to about 10%. In such an embodiment where the relative deviation between the thickness of the first compensating layer CV1a and the thickness of the second compensating layer CV2a is in the range of about 1% to about 10%, the curl phenomenon may not occur even if the thicknesses of the first compensating layer CV1a is different from the thickness of the second compensating layer CV2a.

FIG. 19 illustrates an embodiment where the first thickness t1 of the first compensating layer CV1a is greater than the second thickness t2 of the second compensating layer CV2a, but the disclosure is not limited thereto. In an embodiment, for example, the second thickness t2 of the second compensating layer CV2a may be greater than the first thickness t1 of the first compensating layer CV1a.

Figure 20:
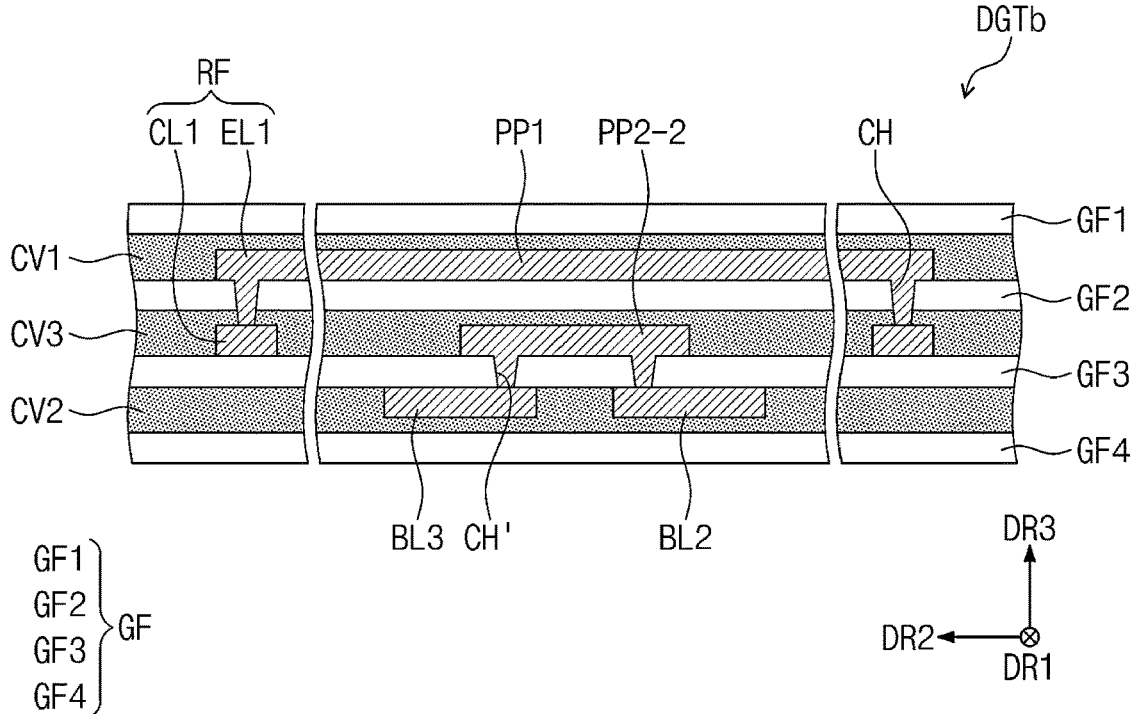
FIG. 20 is a view illustrating a digitizer according to another embodiment of the disclosure.

FIG. 20 is a view illustrating a digitizer according to another embodiment of the disclosure.

The first compensating layer CV1, the second compensating layer CV2, the first to fourth support layers GF1 to GF4, the first sensing coil RF, the (2-2)-th pattern part PP2-2, the second bridge line BL2, and the third bridge line BL3 of FIG. may be the same as the first compensating layer CV1, the second compensating layer CV2, the first to fourth support layers GF1 to GF4, the first sensing coil RF, the (2-2)-th pattern part PP2-2, the second bridge line BL2, and the third bridge line BL3 of FIG. 17, and thus any repetitive detailed description thereof will be omitted or simplified to avoid redundancy.

Referring to FIG. 20, in an embodiment, the digitizer DGTb may further include a third compensating layer CV3. The third compensating layer CV3 may be interposed between the second support layer GF2 and the third support layer GF3. The third compensating layer CV3 may be disposed on the third support layer GF3 to cover the first connection lines CL1 and the (2-2)-th pattern part PP2-2. The third compensating layer CV3 may be a flat top surface. The second support layer GF2 may be disposed on the top surface of the flat third compensating layer CV3.

In an embodiment, for example, the first compensating layer CV1, the second compensating layer CV2, and the third compensating layer CV3 may have a same thickness as each other. However, the disclosure is not limited thereto, and the thickness of at least one selected from the first compensating layer CV1, the second compensating layer CV2, and the third compensating layer CV3 may be different from the thickness of remaining compensating layers.

As described above with reference to FIG. 18, the top surface or the bottom surface of the first to fourth support layers GF1 to GF4 may not be flat due to the first sensing coils RF, the (2-2)-th pattern part PP2-2, the second bridge line BL2, and the third bridge line BL3.

In an embodiment of the disclosure, the first support layer GF1 according to an embodiment of the disclosure may be disposed on the flat top surface of the first compensating layer CV1, the second support layer GF2 may be disposed on the flat top surface of the third compensating layer CV3, and the fourth support layer GF4 may be disposed on the flat bottom surface of the second compensating layer CV2.

Accordingly, in such an embodiment, the top and bottom surfaces of the digitizer DGTb may be flat, and the top surfaces of the display module DM (see FIG. 7) and the window module WM (see FIG. 7) disposed on the digitizer DGTb may also be flat. Accordingly, the surface quality of the display device DD (see FIG. 1) may be improved.

FIG. 20 illustrates an embodiment where three compensating layers CV1, CV2, and CV3 are included, but the disclosure is not limited thereto. In an embodiment, for example, the digitizer DGTb may include at least two or four or more compensating layers.

According to an embodiment of the disclosure, the digitizer may include the first compensating layer to cover the first sensing coil, the second compensating layer to cover the bridge line, and a plurality of support layers disposed on the top surface of the first compensating layer and the bottom surface of the second compensating layer. The support layers may be disposed on the flat top surface of the first compensating layer. The support layer may be disposed on the bottom surface of the second compensating layer. The support layers may be disposed on the flat top surface of the first compensating layer and the flat bottom surface of the second compensating layer, such that the surface quality of the display device may be improved. In such an embodiment, the support layers, the first compensating layer, and the second compensating layer may be arranged symmetrically to each other. Accordingly, the support layers, and the first and second compensating layers may be effectively prevented from being curled, to improve the reliability of the display device.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel including a first non-folding region, a second non-folding region, and a folding region interposed between the first non-folding region and the second non-folding region; and
   a digitizer disposed under the display panel and divided into an active region and a non-active region surrounding the active region, wherein the digitizer includes:

a first sensing coil disposed in the active region;

a first compensating layer disposed on the first sensing coil to cover the first sensing coil;

a second sensing coil disposed under the first sensing coil in the active region;

a bridge line disposed under the second sensing coil; and a second compensating layer disposed under the bridge line to cover the bridge line, wherein a surface of the first compensating layer, which is opposite to a surface of the first compensating layer covering the first sensing coil, is flat, wherein a surface of the second compensating layer, which is opposite to a surface of the second compensating layer covering the bridge line, is flat, and wherein each of the first compensating layer and the second compensating layer has a thickness in a range of about 25 μm to about 74 μm.

2. The display device of claim 1, wherein the thickness of the first compensating layer is equal to the thickness of the second compensating layer.

3. The display device of claim 1, wherein a relative deviation between the thickness of the first compensating layer and the thickness of the second compensating layer is in a range of about 1% to about 10%.

4. The display device of claim 1, further comprising:

a third compensating layer interposed between the first compensating layer and the second compensating layer to cover the second sensing coil.

5. The display device of claim 4, wherein a thickness of the first compensating layer, a thickness of the second compensating layer, and a thickness of the third compensating layer are equal to each other.

6. The display device of claim 4, wherein one of a thickness of the first compensating layer, a thickness of the second compensating layer, and a thickness of the third compensating layer is different from another of the thickness of the first compensating layer, the thickness of the second compensating layer, and the thickness of the third compensating layer.

7. The display device of claim 1, wherein the digitizer further includes:

a first support layer, a second support layer, a third support layer, and a fourth support layer, which are sequentially stacked one on another, and wherein the first support layer is disposed on the first compensating layer, the second support layer is interposed between the first sensing coil and the second sensing coil, the third support layer is interposed between the second sensing coil and the bridge line, and the fourth support layer is disposed under the second compensating layer.

8. The display device of claim 7, wherein each of the first support layer, the second support layer, the third support layer, and the fourth support layer includes at least one selected from glass fiber reinforced plastic, carbon fiber reinforced plastic, and aramid fiber reinforced plastic.

9. The display device of claim 7, wherein a thickness of the first support layer, a thickness of the second support layer, a thickness of the third support layer, and a thickness of the fourth support layer are equal to each other.

10. The display device of claim 1, wherein the first compensating layer and the second compensating layer include epoxy resin.

11. The display device of claim 1, wherein the folding region is foldable about a folding axis parallel to a first direction, wherein a plurality of openings are defined in a portion of the digitizer, which overlaps the folding region when viewed in a plan view, and wherein the openings are arranged in the first direction and a second direction crossing the first direction, and openings arranged in a h-th column are arranged to be offset from openings arranged in a (h+1)-th column, wherein the column corresponds to the first direction, and 'h' is a natural number.

12. A display device comprising:

a display panel; and a digitizer disposed under the display panel, wherein the digitizer includes:

a first sensing coil;

a first compensating layer including a first first surface covering the first sensing coil, and a second first surface opposite to the first first surface;

a second sensing coil disposed under the first sensing coil;

a bridge line disposed under the second sensing coil; and a second compensating layer including a first second surface covering the bridge line and a second second surface opposite to the first second surface, and wherein a shape of the second first surface is symmetrical to a shape of the second second surface, wherein each of the second first surface and the second second surface is flat, and wherein each of the first compensating layer and the second compensating layer has a thickness in a range of 25 μm to 74 μm.

13. The display device of claim 12, wherein the thickness of the first compensating layer is equal to the thickness of the second compensating layer.

14. The display device of claim 12, wherein the thickness of the first compensating layer is different from the thickness of the second compensating layer, wherein a relative deviation between the thickness of the first compensating layer and the thickness of the second compensating layer is in a range of about 1% to about 10%.

15. The display device of claim 12, wherein the digitizer further includes:

a first support layer, a second support layer, a third support layer, and a fourth support layer, which are sequentially stacked one on another, and wherein the first support layer is disposed on the first compensating layer, the second support layer is interposed between the first sensing coil and the second sensing coil, the third support layer is interposed between the second sensing coil and the bridge line, and the fourth support layer is disposed under the second compensating layer.

16. The display device of claim 15, wherein the digitizer includes:

a third compensating layer interposed between the second support layer and the third support layer to cover the second sensing coil.

17. An electronic device comprising a display device for providing images, wherein the display device comprises:

a display panel including a first non-folding region, a second non-folding region, and a folding region interposed between the first non-folding region and the second non-folding region; and a digitizer disposed under the display panel and divided into an active region and a non-active region surrounding the active region, wherein the digitizer includes:

a first sensing coil disposed in the active region;

a first compensating layer disposed on the first sensing coil to cover the first sensing coil;

a second sensing coil disposed under the first sensing coil in the active region;

a bridge line disposed under the second sensing coil; and a second compensating layer disposed under the bridge line to cover the bridge line, wherein a surface of the first compensating layer, which is opposite to a surface of the first compensating layer covering the first sensing coil, is flat, wherein a surface of the second compensating layer, which is opposite to a surface of the second compensating layer covering the bridge line, is flat, and wherein each of the first compensating layer and the second compensating layer has a thickness in a range of about 25 μm to about 74 μm.

\* \* \* \* \*